(12) United States Patent
Moodera et al.

(10) Patent No.: US 11,100,419 B2
(45) Date of Patent: Aug. 24, 2021

(54) MAJORANA PAIR BASED QUBITS FOR FAULT TOLERANT QUANTUM COMPUTING ARCHITECTURE USING SUPERCONDUCTING GOLD SURFACE STATES

(71) Applicant: Massachusetts Institute of Technology, Cambridge, MA (US)

(72) Inventors: Jagadeesh S. Moodera, Somerville, MA (US); Patrick A. Lee, Brookline, MA (US); Peng Wei, Riverside, CA (US); Sujit Manna, New Delhi (IN)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/867,601

(22) Filed: May 6, 2020

(65) Prior Publication Data

US 2020/0356887 A1 Nov. 12, 2020

Related U.S. Application Data

(60) Provisional application No. 62/843,599, filed on May 6, 2019.

(51) Int. Cl.
*H01L 39/08* (2006.01)
*G06N 10/00* (2019.01)
(Continued)

(52) U.S. Cl.
CPC ............ *G06N 10/00* (2019.01); *H01L 27/18* (2013.01); *H01L 29/0673* (2013.01);
(Continued)

(58) Field of Classification Search
CPC ......... H01L 27/18; H01L 39/08; H01L 39/12; B82Y 10/00
See application file for complete search history.

(56) References Cited

U.S. PATENT DOCUMENTS 9,517,931 B2 12/2016 Freedman et al.
10,346,348 B2 7/2019 Hastings et al.
(Continued)

FOREIGN PATENT DOCUMENTS

WO 2019074557 A1 4/2019

OTHER PUBLICATIONS

Wei et al "Superconductivity in the surface state of noble metal gold and its Fermi level tuning by EuS dielectric," https://arxiv.org/abs/1902.09664 Feb. 2019 (Year: 2019).*
(Continued)

*Primary Examiner* — Matthew L Reames
(74) *Attorney, Agent, or Firm* — Smith Baluch LLP

(57) ABSTRACT

Under certain conditions, a fermion in a superconductor can separate in space into two parts known as Majorana zero modes, which are immune to decoherence from local noise sources and are attractive building blocks for quantum computers. Here we disclose a metal-based heterostructure platform to produce these Majorana zero modes which utilizes the surface states of certain metals in combination with a ferromagnetic insulator and a superconductor. This platform has the advantage of having a robust energy scale and the possibility of realizing complex circuit designs using lithographic methods. The Majorana zero modes are interrogated using planar tunnel junctions and electrostatic gates to selectively tunnel into designated pairs of Majorana zero modes. We give example of qubit designs and circuits that are particularly suitable for the metal-based heterostructures.

18 Claims, 13 Drawing Sheets

(51) Int. Cl.
H01L 27/18 (2006.01)
H01L 29/06 (2006.01)
B82Y 10/00 (2011.01)
H01L 39/12 (2006.01)
(52) U.S. Cl.
CPC .............. H01L 39/08 (2013.01); B82Y 10/00 (2013.01); H01L 39/12 (2013.01)

(56) References Cited

U.S. PATENT DOCUMENTS

| | | | |
|---|---|---|---|
| 10,490,600 | B2 | 11/2019 | Freedman et al. |
| 10,593,879 | B2 | 3/2020 | Schrade et al. |
| 2013/0299783 | A1 | 11/2013 | Lutchyn et al. |
| 2019/0013457 | A1 | 1/2019 | Lutchyn et al. |
| 2020/0027971 | A1 | 1/2020 | Freedman et al. |
| 2020/0227636 | A1 | 7/2020 | Jeppesen et al. |

OTHER PUBLICATIONS

Peng et al., "Strong localization of Majorana end states in chains of magnetic adatoms." Physical Review Letters 114.10 (2015): 106801. 5 pages.
Potter et al., "Topological superconductivity and Majorana fermions in metallic surface states." Physical Review B 85.9 (2012): 094516. 9 pages.
Prada et al., "Transport spectroscopy of N S nanowire junctions with Majorana fermions." Physical Review B 86.18 (2012): 180503. 5 pages.
Ren et al., "Topological superconductivity in a phase-controlled Josephson junction." Nature 569.7754 (2019): 93-98.
Rokhinson et al., "The fractional ac Josephson effect in a semiconductor-superconductor nanowire as a signature of Majorana particles." Nature Physics 8.11 (2012): 795-799.
Ruby et al., "Tunneling processes into localized subgap states in superconductors." Physical Review Letters 115.8 (2015): 087001. 5 pages.
Sau et al., "Generic new platform for topological quantum computation using semiconductor heterostructures." Physical Review Letters 104.4 (2010): 040502. 4 pages.
Scheurer et al., "Nonadiabatic processes in Majorana qubit systems," Phys. Rev. B 88, 064515 (2013). 13 pages.
Schrade et al., "Majorana superconducting qubit." Physical Review Letters 121.26 (2018): 267002. 6 pages.
Stanescu et al., "Robust low-energy Andreev bound states in semiconductor-superconductor structures: Importance of partial separation of component Majorana bound states." Physical Review B 100.15 (2019): 155429.
Stanescu et al., Illustrated guide to robust low-energy Andreev bound states in semiconductor-superconductor heterostructures: Importance of partial separation of component Majorana bound states. arXiv: 1811.02557v1. 2018. 18 pages.
Sun et al., "Majorana zero mode detected with spin selective Andreev reflection in the vortex of a topological superconductor." Physical Review Letters 116.25 (2016): 257003. 5 pages.
Sun et al., "Quantum transport through a graphene nanoribbon-superconductor junction." Journal of Physics: Condensed Matter 21.34 (2009): 344204. 10 pages.
Tomanic et al., "Two-band superconductivity of bulk and surface states in Ag thin films on Nb." Physical Review B 94.22 (2016): 220503. 6 pages.
Vuik et al., "Reproducing topological properties with quasi-Majorana states." SciPost Physics 7.5 (2019): 061. 24 pages.
Wang et al., "Evidence for Majorana bound states in an iron-based superconductor." Science 362.6412 (2018): 333-335.
Wei et al., "Exchange-coupling-induced symmetry breaking in topological insulators." Physical Review Letters 110.18 (2013): 186807. 5 pages.

Wei et al., "Induced superconductivity and engineered Josephson tunneling devices in epitaxial (111)-oriented gold/vanadium heterostructures." Nano Letters 16.4 (2016): 2714-2719.
Wei et al., "Strong interfacial exchange field in the graphene/EuS heterostructure." Nature Materials 15.7 (2016): 711-716.
Wei et al., "Superconductivity in the surface state of noble metal gold and its Fermi level tuning by EuS dielectric," arXiv:1902.09664 [cond-mat.supr-con], 23 pp., Feb. 25, 2019.
Wei et al., "Superconductivity in the surface state of noble metal gold and its Fermi level tuning by EuS dielectric," Physical Review Letters 122.24 (2019): 247002. 6 pages.
Williams et al., "Unconventional Josephson effect in hybrid superconductor-topological insulator devices." Physical Review Letters 109.5 (2012): 056803. 5 pages.
Zhang et al., "Quantized majorana conductance." Nature 556.7699 (2018): 74-79.
International Search Report and Written Opinion in International Patent Application No. PCT/US2020/031559 dated Nov. 3, 2020, 14 pages.
Mao et al., "Robustness of Majorana modes and minigaps in a spin-orbit-coupled semiconductor-superconductor heterostructure." Physical Review B 82.17 (2010): 174506. 10 pages.
Aasen et al., "Milestones toward Majorana-based quantum computing." Physical Review X 6.3 (2016): 031016. 28 pages.
Albrecht et al., "Exponential protection of zero modes in Majorana islands." Nature 531.7593 (2016): 206. 18 pages.
Alicea et al., "Non-abelian statistics and topological quantum information processing in 1d wire networks," Nat Phys 7,412 (2011).14T. 23 pages.
Alicea, "New directions in the pursuit of Majorana fermions in solid state systems." Reports on Progress in Physics 75.7 (2012): 076501. 36 references.
Anantram et al., "Current fluctuations in mesoscopic systems with Andreev scattering." Physical Review B 53.24 (1996): 16390. 13 pages.
Beenakker, "Search for Majorana fermions in superconductors." Annu. Rev. Condens. Matter Phys. 4.1 (2013): 113-136.
Bonderson et al., "Measurement-only topological quantum computation." Physical Review Letters 101.1 (2008): 010501. 4 pages.
Colbert et al., "Proposal to measure the quasiparticle poisoning time of Majorana bound states." Physical Review B 89.14 (2014): 140505. 5 pages.
Das et al., "Zero-bias peaks and splitting in an Al—InAs nanowire topological superconductor as a signature of Majorana fermions." Nature Physics 8.12 (2012): 887-895.
Deng et al., "Anomalous zero-bias conductance peak in a Nb—InSb nanowire-Nb hybrid device." Nano Letters 12.12 (2012): 6414-6419.
Deng et al., "Majorana bound state in a coupled quantum-dot hybrid-nanowire system." Science 354.6319 (2016): 1557-1562.
Desjardins et al., "Synthetic spin-orbit interaction for Majorana devices." Nature Materials 18.10 (2019): 1060-1064.
Feldman et al., "High-resolution studies of the Majorana atomic chain platform." Nature Physics 13.3 (2017): 286. 7 pages.
Finck et al., "Anomalous modulation of a zero-bias peak in a hybrid nanowire-superconductor device." Physical Review Letters 110.12 (2013): 126406. 5 pages.
Fisher et al., "Relation between conductivity and transmission matrix." Physical Review B 23.12 (1981): 6851. 4 pages.
Fornieri et al., "Evidence of topological superconductivity in planar Josephson junctions." Nature 569.7754 (2019): 89-92.
Fu et al., "Superconducting proximity effect and Majorana fermions at the surface of a topological insulator." Physical Review Letters 100.9 (2008): 096407. 4 pages.
Fu, "Electron Teleportation via Majorana Bound States in a Mesoscopic Superconductor," Physical Review Letters, 104, 056402 (2010). 4 pages.
He et al., "Chiral Majorana fermion modes in a quantum anomalous Hall insulator-superconductor structre." Science 357.6348 (2017): 294-299.
Jäck et al., "Observation of a Majorana zero mode in a topologically protected edge channel." Science 364.6447 (2019): 1255-1259.

(56) References Cited

OTHER PUBLICATIONS

Jeon et al., "Distinguishing a Majorana zero mode using spin-resolved measurements." Science 358.6364 (2017): 772-776.
Karzig et al., "Scalable designs for quasiparticle-poisoning-protected topological quantum computation with Majorana zero modes." Physical Review B 95.23 (2017): 235305. 32 pages.
Karzig et al., "Boosting Majorana Zero Modes," Phys. Rev. X 3, 041017 (2013). 16 pages.
Karzig et al., "Optimal control of Majorana zero modes," Phys. Rev. B 91, 204104 (2015). 5 pages.
Kästle et al., "Growth of thin, flat, epitaxial (111) oriented gold films on c-cut sapphire." Surface Science 498.1-2 (2002): 168-174.
Katmis et al., "A high-temperature ferromagnetic topological insulating phase by proximity coupling." Nature 533.7604 (2016): 513-516.
Kells et al., "Near-zero-energy end states in topologically trivial spin-orbit coupled superconducting nanowires with a smooth confinement." Physical Review B 86.10 (2012): 100503. 5 pages.
Kitaev, "Fault-tolerant quantum computation by anyons." Annals of Physics 303.1 (2003): 2-30.
Kitaev, "Unpaired Majorana fermions in quantum wires." Physics-Uspekhi 44.10S (2001): 131. 7 pages.
Kliewer et al., "Dimensionality effects in the lifetime of surface states." Science 288.5470 (2000): 1399-1402.
Lashell et al., "Spin splitting of an Au (111) surface state band observed with angle resolved photoelectron spectroscopy." Physical Review Letters 77.16 (1996): 3419. 4 pages.
Law et al., "Majorana fermion induced resonant Andreev reflection." Physical Review Letters103.23 (2009): 237001. 4 pages.
Law et al., "Robustness of Majorana fermion induced fractional Josephson effect in multichannel superconducting wires." Physical Review B 84.8 (2011): 081304. 4 pages.
Lee et al., "Anderson localization in two dimensions." Physical Review Letters 47.12 (1981): 882. 4 pages.
Lee, "Proposal for Creating a Spin-polarized $p_x + ip_y$ State and Majorana Fermions." arXiv preprint arXiv:0907.2681 (2009). 2 pages.
Li et al., "Superconducting spin switch with infinite magnetoresistance induced by an internal exchange field." Physical Review Letters 110.9 (2013): 097001. 5 pages.
Litinski et al., "Quantum computing with Majorana fermion codes." Physical Review B 97.20 (2018): 205404. 27 pages.
Liu et al., "Majorana fermion induced nonlocal current correlations in spin-orbit coupled superconducting wires." Physical Review B 88.6 (2013): 064509. 7 pages.
Lutchyn et al., "Majorana fermions and a topological phase transition in semiconductor-superconductor heterostructures." Physical Review Letters 105.7 (2010): 077001. 4 pages.
Lutchyn et al., "Majorana zero modes in superconductor-semiconductor heterostructures." Nature Reviews Materials (2018): 1. 17 pages.
Manna et al., "Demonstration of a pair of Majorana zero modes in superconducting gold surface states," APS Annual Meeting, Mar. 7, 2019, 24 pp.
Manna et al., "Signature of a pair of Majorana zero modes in superconducting gold surface states." Proceedings of the National Academy of Sciences Apr. 2020, 117 (16) 8775-8782; DOI: 10.1073/pnas.1919753117, 8 pages.
Manna et al., "Signature of a Pair of Majorana Zero Modes in Superconducting Gold Surface States." arXiv:1911.03802 [Submitted on Nov. 9, 2019 (v1), last revised Apr. 11, 2020 (this version, v2)], 37 pages.
Ménard et al., "Isolated pairs of Majorana zero modes in a disordered superconducting lead monolayer." Nature Communications 10.1 (2019): 1-7.
Miao et al., "Spin manipulation with magnetic semiconductor barriers." Physical Chemistry Chemical Physics 17.2 (2015): 751-761.
Moodera et al., "The phenomena of spin-filter tunnelling." Journal of Physics: Condensed Matter 19.16 (2007): 165202. 25 pages.
Mourik et al., "Signatures of Majorana fermions in hybrid superconductor-semiconductor nanowire devices." Science 336.6084 (2012): 1003-1007.
Nadj-Perge et al., "Observation of Majorana fermions in ferromagnetic atomic chains on a superconductor." Science 346.6209 (2014): 602-607.
Nicolay et al., "Spin-orbit splitting of the L-gap surface state on Au (111) and Ag (111)." Physical Review B 65.3 (2001): 033407. 4 pages.
Oreg et al., "Helical liquids and Majorana bound states in quantum wires." Physical Review Letters 105.17 (2010): 177002. 4 pages.

\* cited by examiner

MAJORANA PAIR BASED QUBITS FOR FAULT TOLERANT QUANTUM COMPUTING ARCHITECTURE USING SUPERCONDUCTING GOLD SURFACE STATES

CROSS-REFERENCE TO RELATED APPLICATION(S)

This application claims the priority benefit, under 35 U.S.C. 119(e), of U.S. Application No. 62/843,599, filed on May 6, 2019, which is incorporated herein by reference in its entirety.

GOVERNMENT SUPPORT

This invention was made with Government support under Grant Nos. DMR1207469 and DMR1700137 awarded by the National Science Foundation (NSF), Grant Nos. N00014-16-1-2657 and N00014-13-1-0301 awarded by the Office of Naval Research (ONR), and Grant No. DE-FG02-03ER46076 awarded by the Department of Energy (DOE). The Government has certain rights in the invention.

BACKGROUND

Majorana zero modes (MZMs) are fermionic states, each of which is an antiparticle of itself. MZMs always appear in pairs. Each MZM pair has the degrees of freedom of a single fermion, which is split non-locally in space into two MZMs. The nonlocality implies that MZMs are immune to local perturbations, and hence they have been proposed as ingredients of topological qubits that are protected from decoherence due to local noise sources. MZMs obey non-Abelian statistics, meaning that exchanging their positions leads to a new quantum state and not just a change of the phase angle as is the case for abelian Anyons. These exotic properties make MZMs a potential building block for topological quantum computing.

MZM pairs are predicted to exist at the ends of one-dimensional topological superconductors (SC), such as triplet p-wave SCs. Since these SCs have not been found in nature, various proposals have been made to engineer them by combining more conventional materials. The ingredients for making these engineered SCs include strong spin-orbit coupling of the Rashba type, proximity coupling to a superconductor, and a magnetic field parallel to the wire. The most detailed study to date has been done in semiconductor nanowires, such as InSb and InAs, that are proximity coupled to a superconductor, such as NbTiN or Al.

The sought-after signature of an MZM in a semiconductor nanowire is zero bias peaks (ZBPs) appearing simultaneously in the tunneling spectra at both ends of the semiconductor nanowire. Despite great progress, there remains an on-going debate in the community as to whether the signal is due to MZMs that are located at the wire's ends. The issue is that in the semiconducting system, the tunnel barriers are gate controlled and are smoothly varying. In this situation, theory suggests that two MZMs can exist in close proximity near one end, but couple very differently across the tunnel barrier so that the tunneling spectrum mimics that of an isolated MZM. To date, ZBPs have not been reported to appear simultaneously at both ends of a semiconducting wire, so that there is no direct evidence yet of non-locality.

A second system that has received a lot of attention is an atomic chain of Fe atoms formed on a Pb substrate. While a ZBP has been reported by scanning tunneling spectroscopy (STS) at one end of the chain, the other end is often attached to an island and not easily accessible, making it challenging to verify the appearance of a ZBP at the other end of the atomic chain. Furthermore, the ZBPs cannot be removed by tuning some parameter, such as the local electric or magnetic field, and it is not possible to test for their simultaneous onset at both ends of the atomic chain.

More generally, neither semiconductor nanowires nor atomic chains of Fe atoms are scalable, i.e., experimentally creating a network of more than a few wires or atomic chains is highly challenging, making the ultimate goal of creating an ensemble of qubits very difficult. As a way to overcome this, there has been recent progress using lithography to create wires on 2D substrates using slits in planar Josephson junctions, leading to a topological SC.

SUMMARY

Here, we introduce a platform for generating MZMs utilizing thin, (111) oriented gold films coupled to a superconductor. The superconductor is on a clean, flat substrate and is thick enough to induce superconductivity in the gold film. The surface of the gold film is covered with a magnetic insulator, such as europium sulfide (EuS) that is two atomic layers thick. With nanostructures of EuS patterned on the gold film, such as EuS islands or nanowires, MZMs can appear simultaneously at both ends of the nanostructure under an applied magnetic field. This superconductor/gold film/magnetic insulator platform can be prepared lithographically and is readily scalable to hundreds or thousands of islands in a single device.

We have developed two nano-fabrication processes for fabricating scalable nanowires that carry MZMs using gold (111) heterostructures. In the first process, scalable gold (111) nanowires are fabricated on top of a superconducting vanadium film, which is in turn on a substrate made of, e.g., silicon, sapphire, mica, glass, polymer, or plastic. The top surface of the gold (111) nanowire is then uniformly covered by a thin layer of EuS. In the second process, scalable EuS nanostructures are fabricated on the top surface of a gold (111) film, which is coupled to superconducting vanadium film. These processes for creating MZM platforms are readily scalable and can be used to create complex circuit networks of hundreds to thousands of nanostructures, enabling the creation of Majorana-based qubits as building blocks for topological quantum computing.

An MZM platform can be made with other materials as well. Instead of Au(111) film, for instance, an MZM platform may be made with a material that has large Rashba split surface bands, such as silver, platinum, or bismuth. Similarly, magnetic insulators other than EuS would work as well; suitable insulators can provide a planar exchange field at the gold/insulator interface and include EuO, GdN, magnetic perovskites such as LaCuMnO, CrTe, dilute magnetic semiconductors such as GaMnAs, and ferrites such as YIG. The magnetic insulator may be about 0.3 nm thick or thicker. And the superconductor can be any superconductor that displays a clean superconducting gap, induces superconductivity in the adjacent layer, and withstands a total magnetic field large enough to be able to observe the Majorana zero modes.

An example MZM platform may include a substrate, a superconducting film on the substrate, a conductive film on the superconducting film, a magnetic insulator on a free surface of the conductive film, and a magnetic field source. The free surface of the conductive film has a Rashba spin-orbit splitting of at least 1 meV. In operation, the magnetic insulator shifts a Fermi level of the conductive film and generates an exchange field. And the magnetic field source applies a magnetic field to the superconducting substrate, the conductive film, and the magnetic insulator. The magnetic field and the exchange field cause a Majorana zero mode (MZM) to form at opposite ends of the magnetic insulator.

The superconducting film may include vanadium, niobium, titanium, tin, aluminum, gallium, nitrogen, germanium, and/or silicon, including alloys thereof.

The conductive film may include a (111) gold film, a (111) silver film, a platinum film, or a bismuth film. The conductive film can be patterned into a wire, with the magnetic insulator forming an island with an edge overlapping an edge of the wire. For example, the wire may form a shape that supports at least four MZMs, such as an "H" or an "N." In such cases, the apparatus may also include first and second tunnel leads coupled to first and second ends of the wire, respectively, with the magnetic insulator optionally serving as a tunnel barrier. These first and second tunnel leads detect first and second zero bias peaks (ZBPs), respectively, that are associated with the MZM. The apparatus may also include a gate, coupled to the wire between the first end and the second end, to modulate a chemical potential of the magnetic insulator. The magnetic insulator may act as a gate dielectric.

The magnetic insulator may include at least two monolayers of EuS, EuO, GdN, CrTe, a magnetic perovskite such as LaCuMnO, CrTe, a dilute magnetic semiconductor such as GaMnAs, or a ferrite such as YIG etc. The magnetic insulator can be patterned into a wire as well as or instead of the conductive film.

Another MZM platform includes a superconductor, a conductive film on the superconductor, a magnetic insulating wire on the conductive film, tunneling junctions, and top gates. The magnetic insulating wire shifts a Fermi level of the conductive film and generates an exchange field such that a Majorana zero mode (MZM) forms at ends of the magnetic insulating wire in response to the exchange field and to an external magnetic field. The tunneling junctions, which are in electrical communication with the ends of the magnetic insulating wire, measure the MZM. And the top gates, which are on the magnetic insulating wire, actuate the tunneling junctions.

The conductive film, magnetic insulating wire, tunneling junctions, and top gates can be on a Coulomb blockade island. The conductive film can be patterned, and the MZM platform can also include a conductive interference arm in parallel with the conductive film and another gate. This other gate is in electrical communication with the conductive interference arm and modulates a resistance of the conductive interference arm. Multiple copies of this platform can be arranged in an array that forms part of a quantum circuit.

A method of generating and measuring MZMs comprises applying a magnetic field to a conductive film disposed between a superconductor and a magnetic insulator and having a Rashba spin-orbit splitting of at least 1 meV. First and second ZBPs are measured at opposite ends of the magnetic insulator, indicating formation of an MZM at the opposite ends of the magnetic insulator.

These platforms can be made by forming a conductive film having a free surface with a Rashba spin-orbit splitting of at least 1 meV on a superconducting film, then depositing a magnetic insulator on the free surface of the conductive film to shift a Fermi level of the conductive film and to generate an exchange field. The conductive film can be patterned before deposition of the magnetic insulator. The conductive film and/or the magnetic insulator can be patterned into a wire, with tunnel leads deposited at the ends of the wire and a gate formed on the wire between the ends of the wire. The magnetic insulator can be patterned to support at least four Majorana zero modes (e.g., in an N or H shape).

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. The terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

FIG. 1A shows an Au(111) thin film nanowire proximity coupled to a conventional superconductor vanadium, while the EuS is grown epitaxially on top of the Au nanowires. The dotted line represents the location of the surface state (SS). An external field is applied parallel to the wire in order to drive the system into a topological superconducting state. A scanning tunneling microscopy (STM) with a normal tip is used to probe the part of the MZM that leaks out from underneath the EuS island.

Figure 1B:
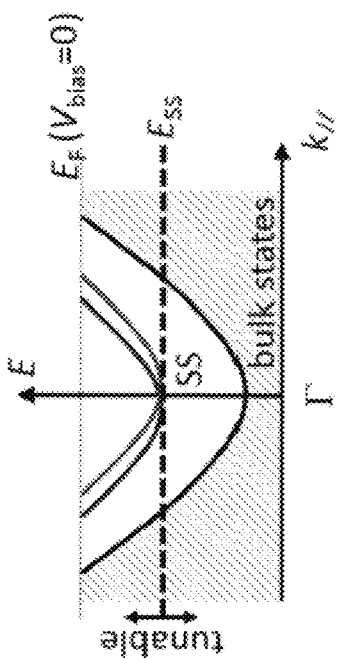
FIG. 1B is a plot of the schematic surface state Rashba split band structure, which is isolated from the projected bulk bands, for the structure shown in FIG. 1A. The position of the bottom of the surface band ($E_{SS}$) can be tuned by varying the thickness of the EuS coverage.
Figure 1A:
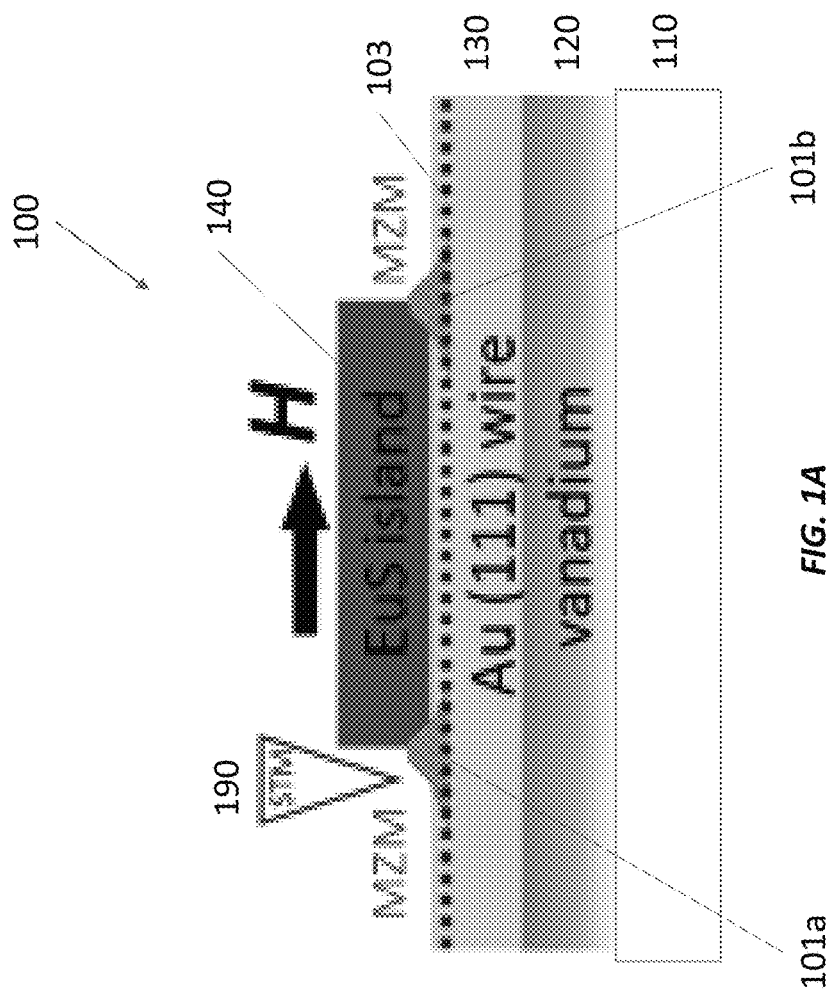
FIG. 1C shows large scale (650 nm×650 nm) STM with constant current ($V_{sample}$=1.2 V, $I_{set}$=55 pA, T=2 K) topographical scans of a nanowire network prepared using nanofabrication techniques.
Figure 1E:
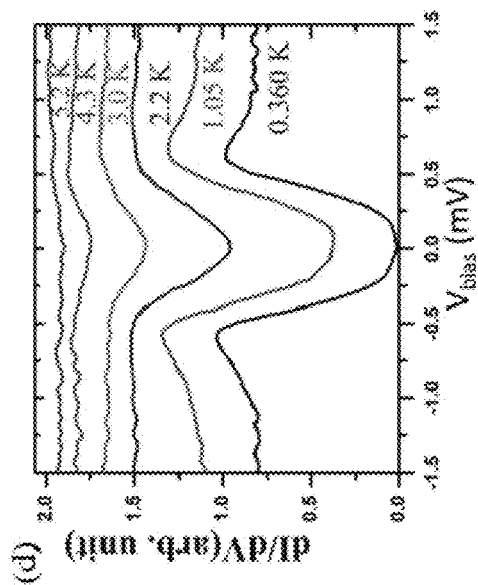
Figure 1D:
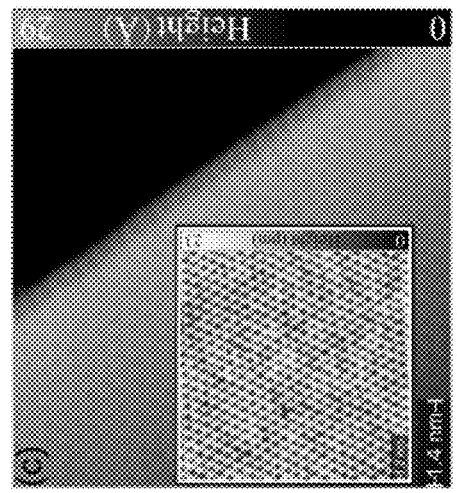

FIG. 1D shows a zoomed-in (7 nm×7 nm) (shown by the square box in FIG. 1C) topography of an Au nanowire, which has a sharp interface with the underlining vanadium film ($V_{sample}$=0.36 V, $I_{set}$=230 pA, T=2 K). The inset shows the atomically resolved STM topography image ($V_{sample}$=−150 mV, $I_{set}$=0.6 nA, T=2 K) of the Au nanowire top surface, which shows the hexagonal atomic lattice of Au(111) surface.

FIG. 1E shows temperature-dependent dI/dV spectra measured on an atomically resolved Au nanowire surface. The spectra are spatially averaged over a 1.5 nm×1.5 nm area located at the bottom right corner of the device shown in the inset of FIG. 1D. The spectra are vertically shifted for clarity and normalized by the data measured above $T_c$(~5 K).

Figure 1C:
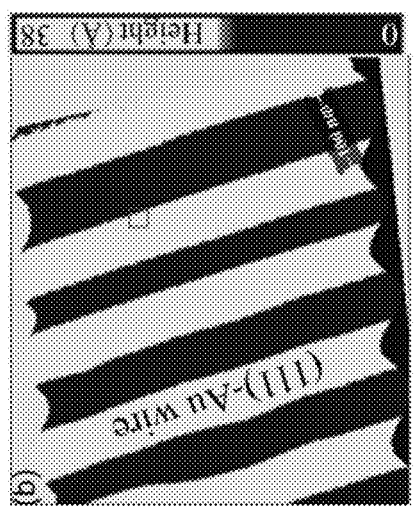
Figure 2B:
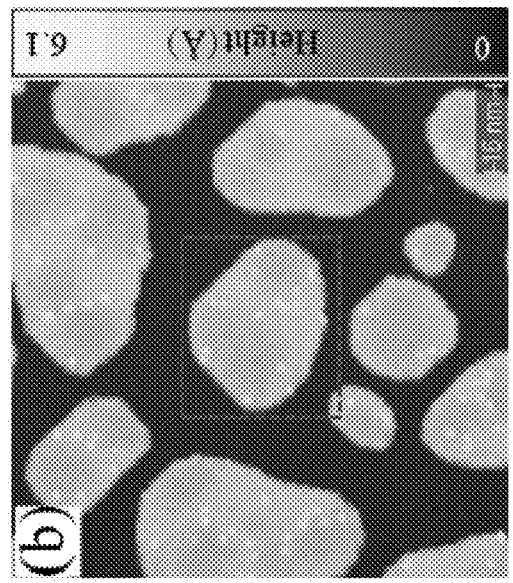
Figure 2D:
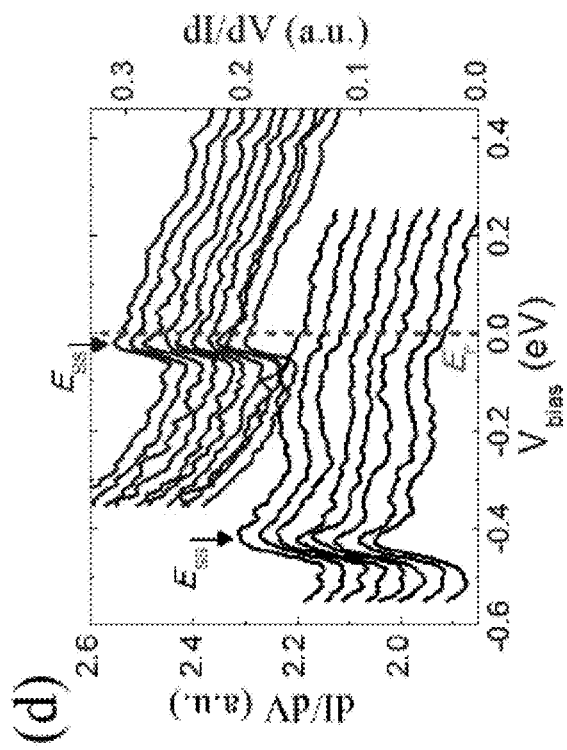
Figure 2A:
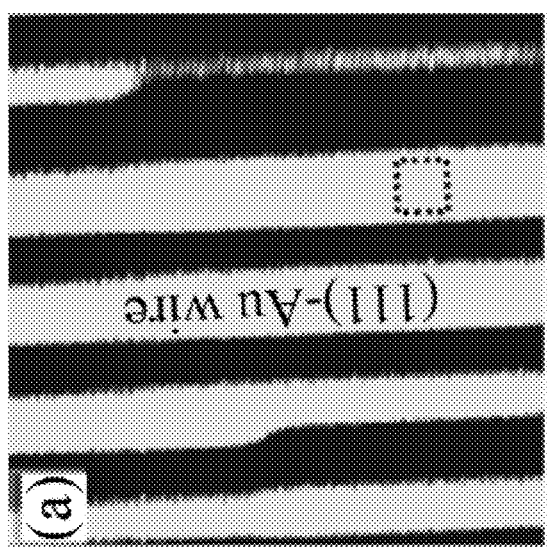

FIG. 2A shows a large-scale STM topography image of an Au(111) nanowire array (similar to that in FIG. 1C) with two monolayers of EuS deposited over it ($V_{sample}$=1.0 V, $I_{set}$=80 pA, T=0.38 K).

FIG. 2B shows a zoomed-in STM topography image (80 nm×80 nm, $V_{sample}$=0.8 V, $I_{set}$=210 pA, T=0.38K) of the area denoted by the dotted square in FIG. 2A. The EuS islands are clearly visible.

Figure 2C:
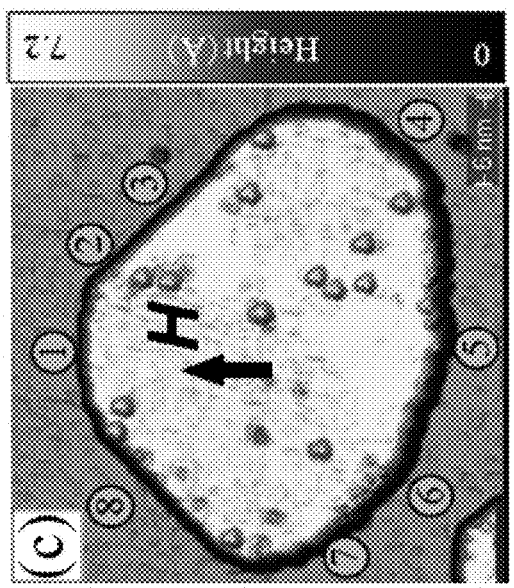

FIG. 2C shows a further zoomed-in STM topography image (35 nm×35 nm, $V_{sample}$=0.5 V, $I_{set}$=0.5 pA, T=0.38 K) of the EuS island surrounded by the dotted square in FIG. 2B.

FIG. 2D shows TS (dI/dV vs $V_{bias}$) spectra over large bias voltages on both the bare Au(111) surface (lower traces) and the EuS island (upper traces) in the device shown in FIGS. 2A-2C. A clear shift of $E_{ss}$ (bottom of the surface band) towards $E_F$ is seen, which shows that the Fermi level of the gold surface state underneath two monolayer EuS is above 30 meV relative to $E_{SS}$. The weak position dependence of the spectra as shown by the multiple dI/dV scans along a line illustrates the homogeneity of the sample. The curves are shifted vertically for clarity.

Figures 3A, 3B, 3C, 3D:
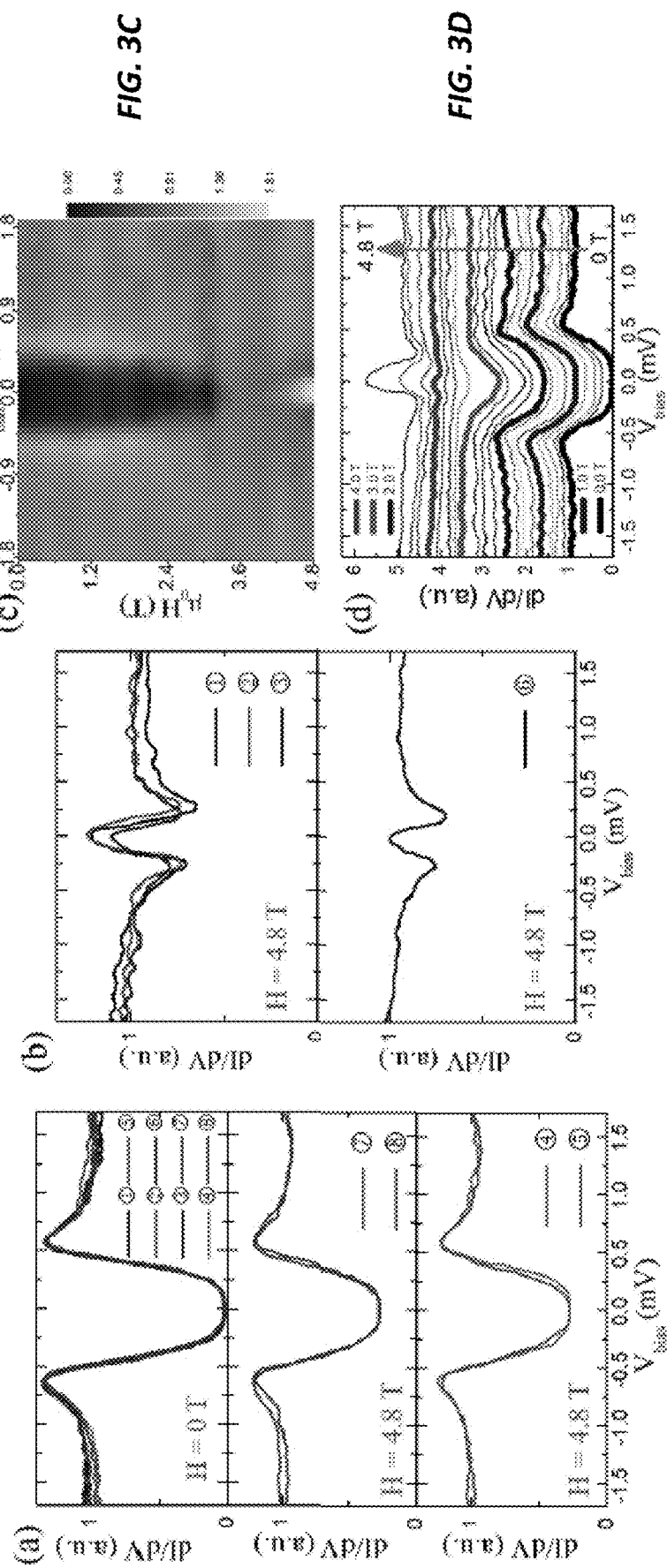

FIG. 3A shows tunneling dI/dV spectra at different positions (positions 1 through 8) surrounding the EuS island acquired at T=0.38 K as shown in FIG. 2C. Top panel shows that when the applied magnetic field is zero (H=0 T), the dI/dV spectra at all positions are fully gapped. The lower panels show that in a magnetic field (H=4.8 T) the dI/dV spectra at positions 4, 5, 7, 8 are partly filled in, but the coherence peak at the pairing gap remains intact. FIG. 2C shows the direction of the magnetic field.

FIG. 3B shows tunneling dI/dV spectra with sharp ZBPs emerging at positions 1, 2, 3 and 6. This is consistent with the expected appearance of a pair of MZM on opposite ends of an EuS island as defined by the magnetic field.

FIG. 3C shows a two-dimensional (2D) density plot of the dI/dV data in FIGS. 3A and 3B showing the topological transition of the MZM. The data are taken at a location near position 6 of the island shown in FIG. 2C. When the applied field increases, the superconducting gap is filled in, then it crosses over to a ZBP at sufficiently large magnetic field.

FIG. 3D shows detailed line scans of the data in FIG. 3C for applied magnetic field changing in small steps from 0 T to 4.8 T. The dI/dV spectra are vertically shifted for clarity. Before shifting, each spectrum is normalized to 1 at the largest $V_{bias}$. Starting from the bottom spectrum (field is 0 T), each vertically shifted spectrum is for a magnetic field increased in steps of 0.25 T, except for the last spectrum (the topmost one) which has an applied field of 4.8 T. This detailed line scan plot shows that the spectrum evolves from a "U" shape to a "V" shape before completely closing, and a ZBP emerges above the filled-in gap. These data resemble the theoretical results shown in FIG. 6C with T=700 mK.

Figures 4A, 4B, 4C, 4D, 4E, 4F, 4G:
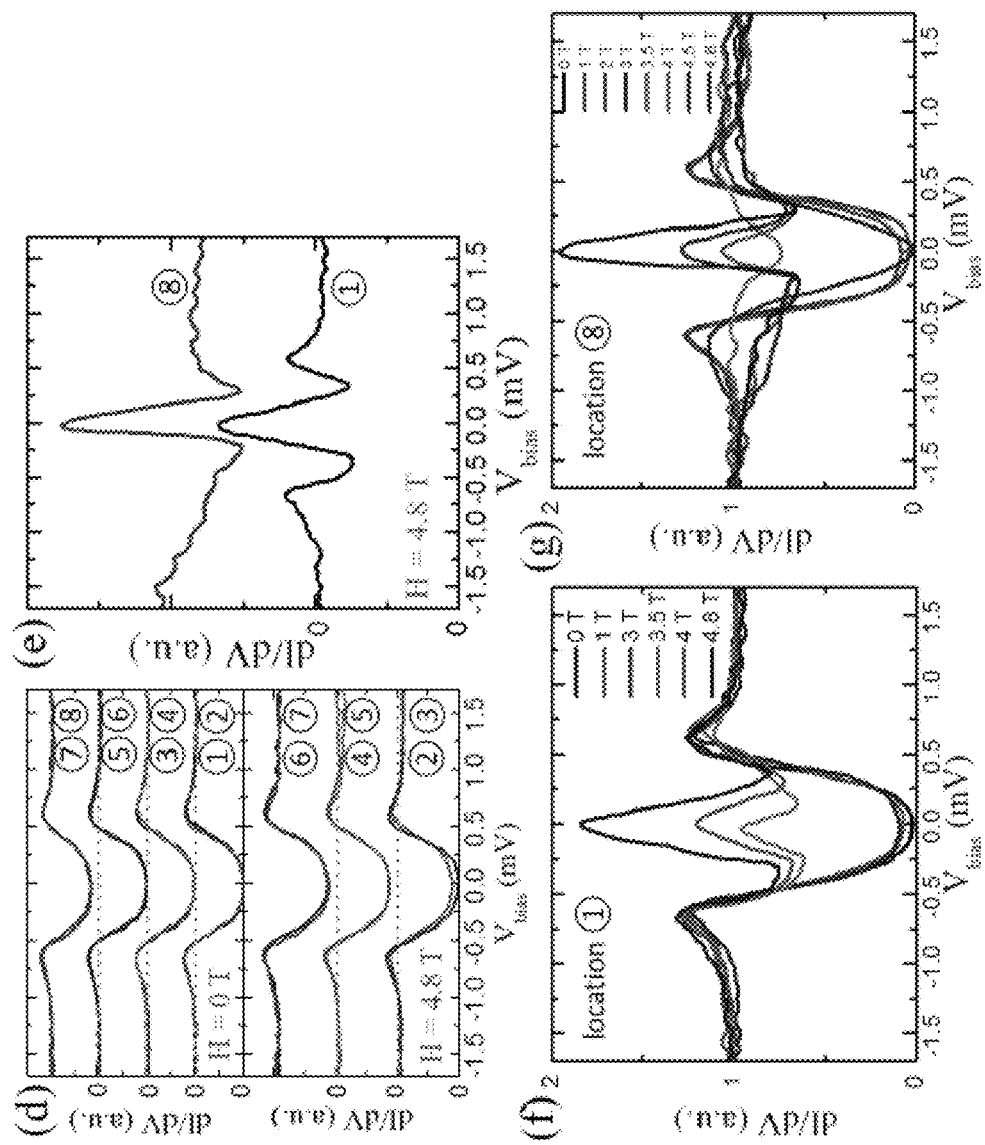

FIG. 4A shows an STM topography image of another Au(111) nanowire array (similar to that in FIG. 2A) with two monolayers of EuS deposited over it ($V_{sample}$=1.6 V, $I_{set}$=46 pA, T=0.38 K). The applied magnetic field is aligned with the nanowire to the best accuracy of the STM setup.

FIG. 4B shows a zoomed-in STM topography image (75 nm×75 nm, $V_{sample}$=1 V, $I_{set}$=0.5 pA) of a relatively large EuS island sitting at the edge of the Au nanowire in FIG. 4A. The island is approximately 40 nm long along the wire and 60 nm wide.

FIG. 4C shows the atomically resolved (4 nm×4 nm, $V_{sample}$=120 mV, $I_{set}$=600 pA) EuS surface in the marked region noted in FIG. 4B.

FIG. 4D shows a comparison of the dI/dV tunneling spectra under both H=0 T (upper plot) and H=4.8 T (lower plot) at the positions marked in FIG. 4B. Dashed lines mark the zero conductance of each shifted spectrum. The spectra at these positions are gapped when H=0 T. A slight filling in of the gap is seen at positions 2-7 in the 4.8 T field. (The dI/dV spectra in FIGS. 4D-4G are normalized to the normal state conductance.)

FIG. 4E shows that a sharp ZBP emerges for H=4.8 T at positions 1 and 8. Curve 8 is shifted vertically by two tick marks.

FIGS. 4F and 4G show the evolution of the dI/dV spectra at positions 1 and 8, respectively, as a function of the strength of the applied field. At 3.5 T, the gap is largely filled in at positions 1 and 8 simultaneously. The ZBP is visible at 3.5 T at position 1 and at 4 T at position 8. At 4 T field and above, the ZBPs at positions 1 and 8 show comparable peak heights.

Figures 5A, 5B, 5C, 5D:
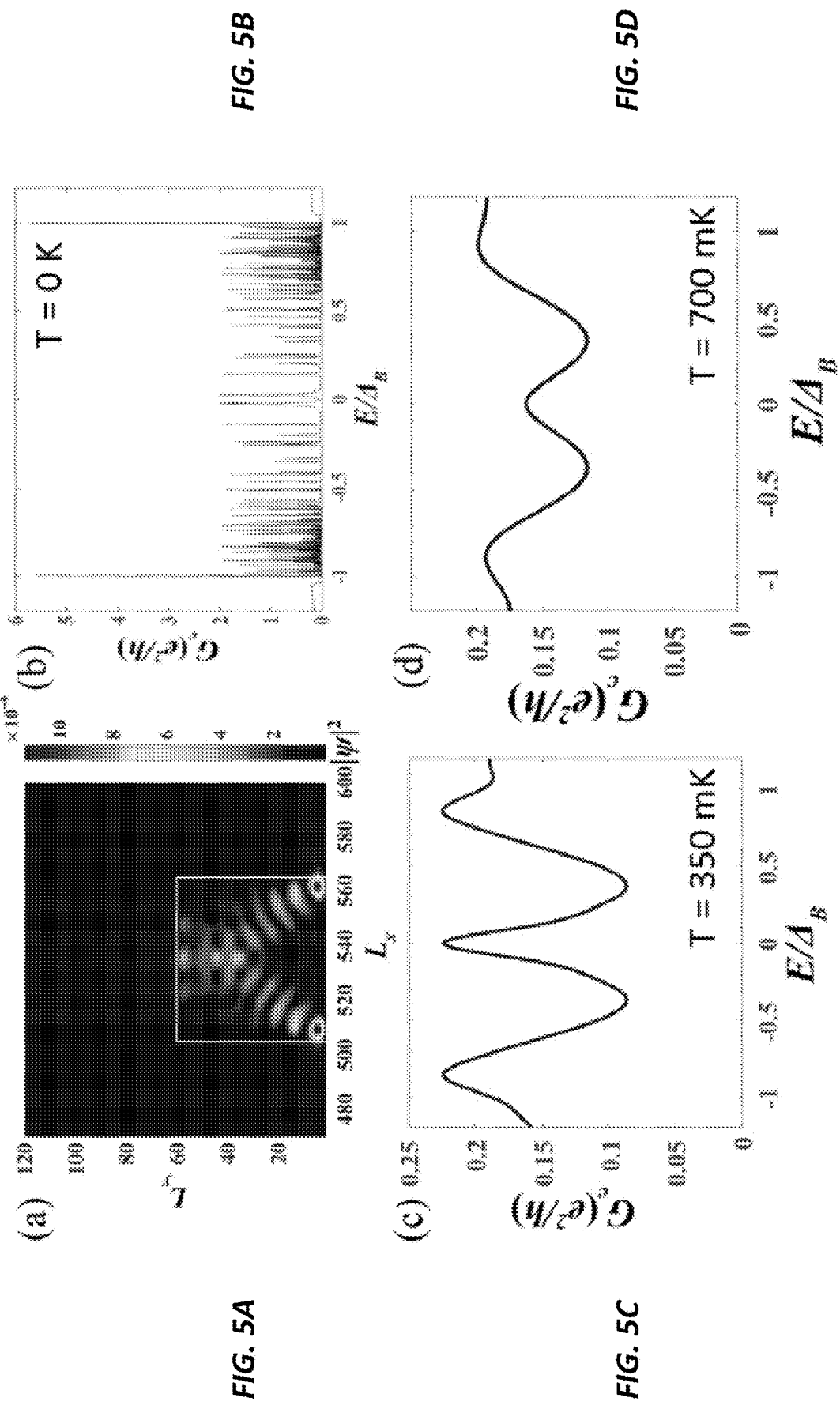

FIG. 5A shows the absolute value of the MZM wavefunction for a simulated 60 nm×60 nm island of EuS deposited on a 120 nm wide Au wire.

FIGS. 5B, 5C, and 5D show simulated tunneling spectra at T=0, and T=350 mK, and T=700 mK taken at a point near the edge just outside the EuS island of FIG. 5A.

Figure 6A:
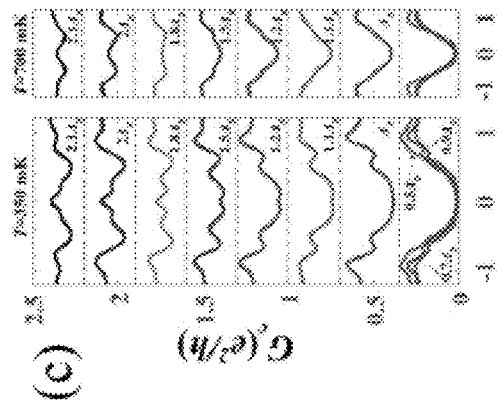

FIG. 6A shows a simulation of the lowest 25 eigenvalues plotted versus the effective Zeeman energy $V_x$ for a 60 nm×300 nm island of EuS that overlaps the edge of a 120 nm wide Au wire.

Figure 6C:
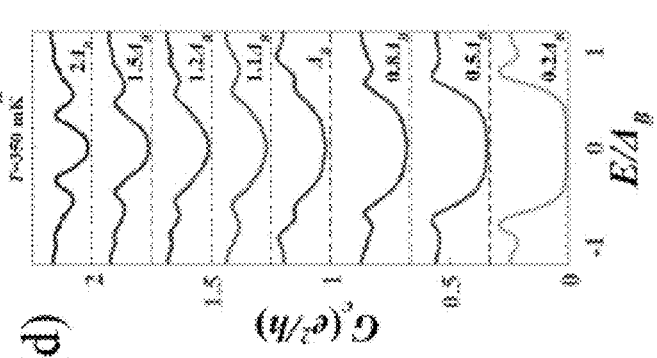
Figure 6B:
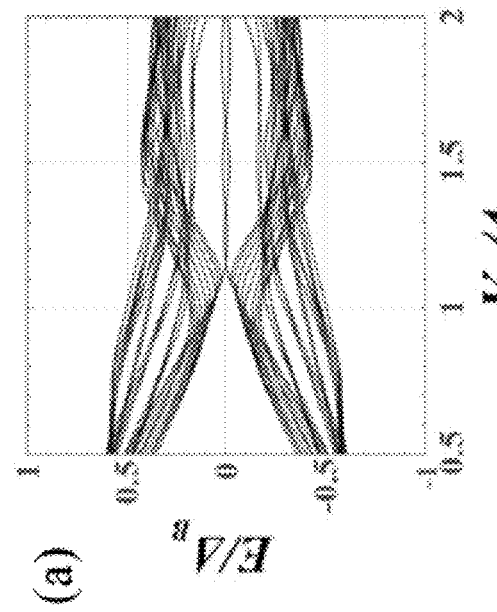
Figure 6D:
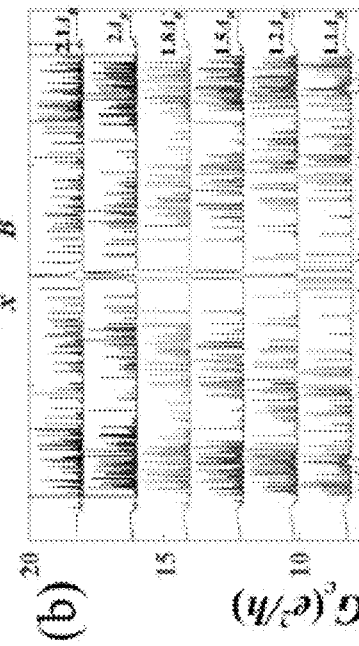

FIGS. 6B, 6C, and 6D show simulated tunneling spectra at T=0, and T=350 mK, and T=700 mK taken at a point just outside the EuS island of FIG. 6A.

Figure 7B:
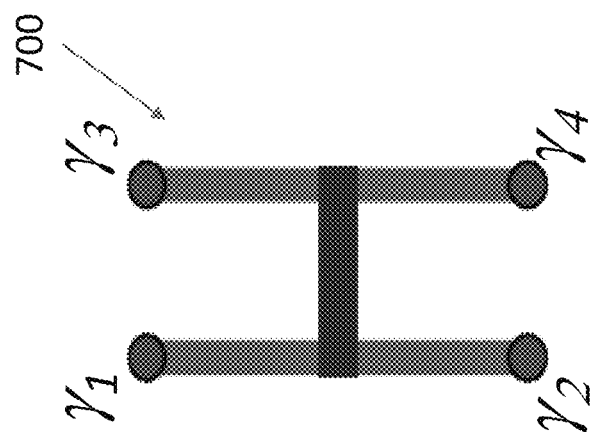
Figure 7A:
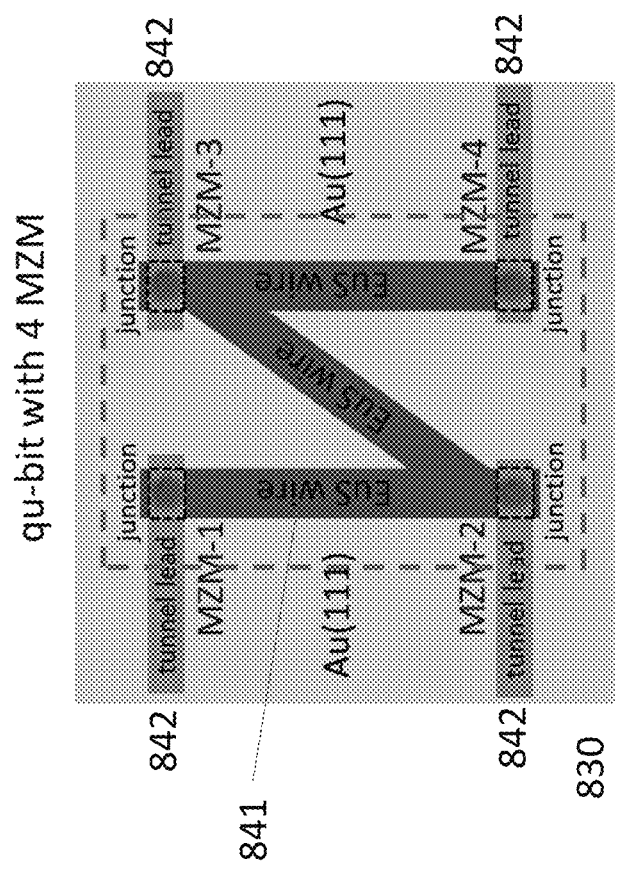

FIG. 7A shows a schematic of an N-shaped wire network that supports four MZMs.

FIG. 7B shows an H-shaped wire network called a "tetron." In this case, the cross bar of the H can be a conventional superconductor.

Figures 8A, 8B:
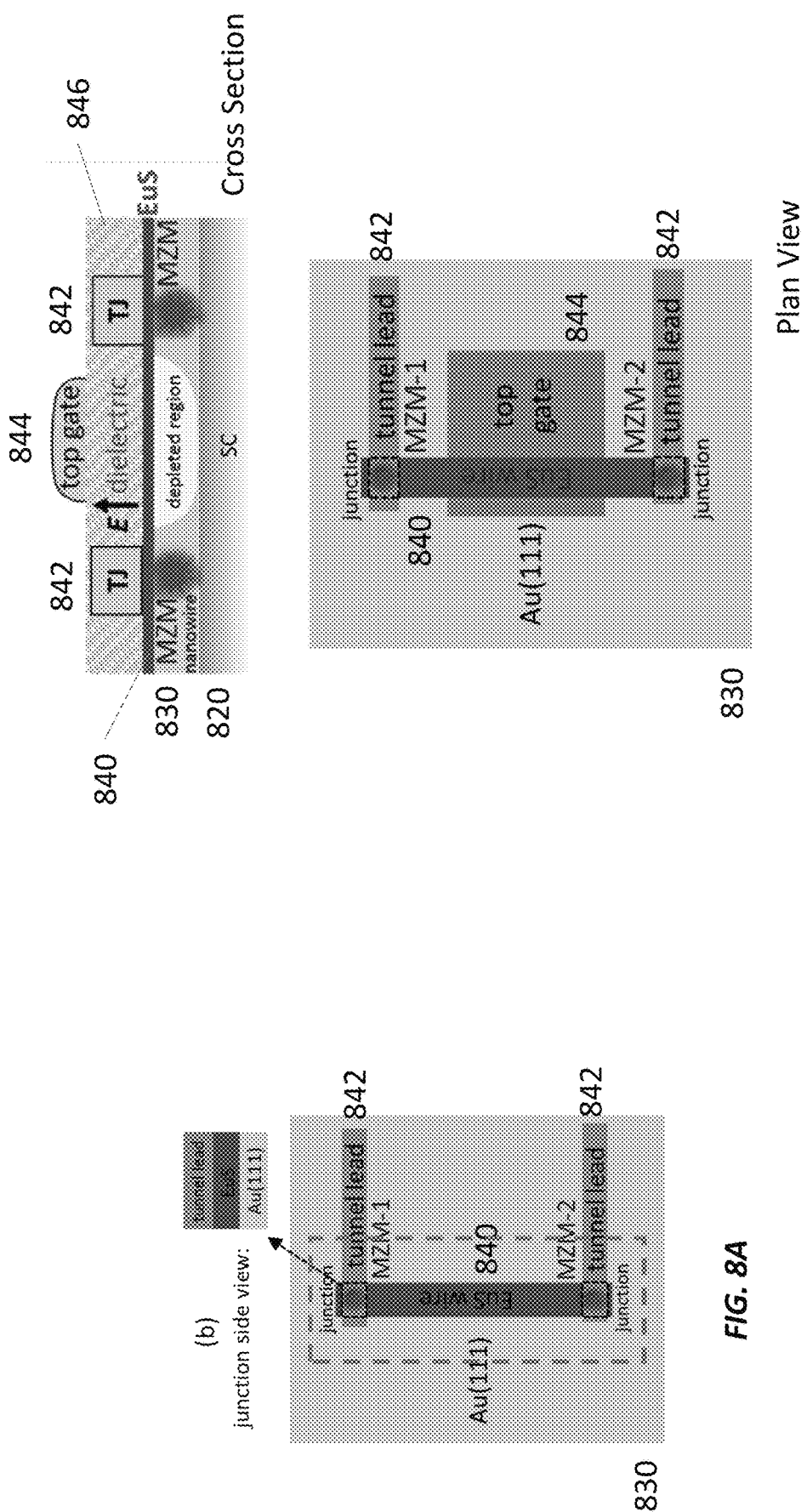

FIG. 8A shows an MZM platform with EuS wires and tunnel leads of a planar junction on a gold film.

FIG. 8B shows the MZM platform of FIG. 7A with additional dielectric and a gate electrode.

FIGS. 9A-9D illustrate the operation of a single tetron qubit like the one in FIG. 8C.

Figure 10:
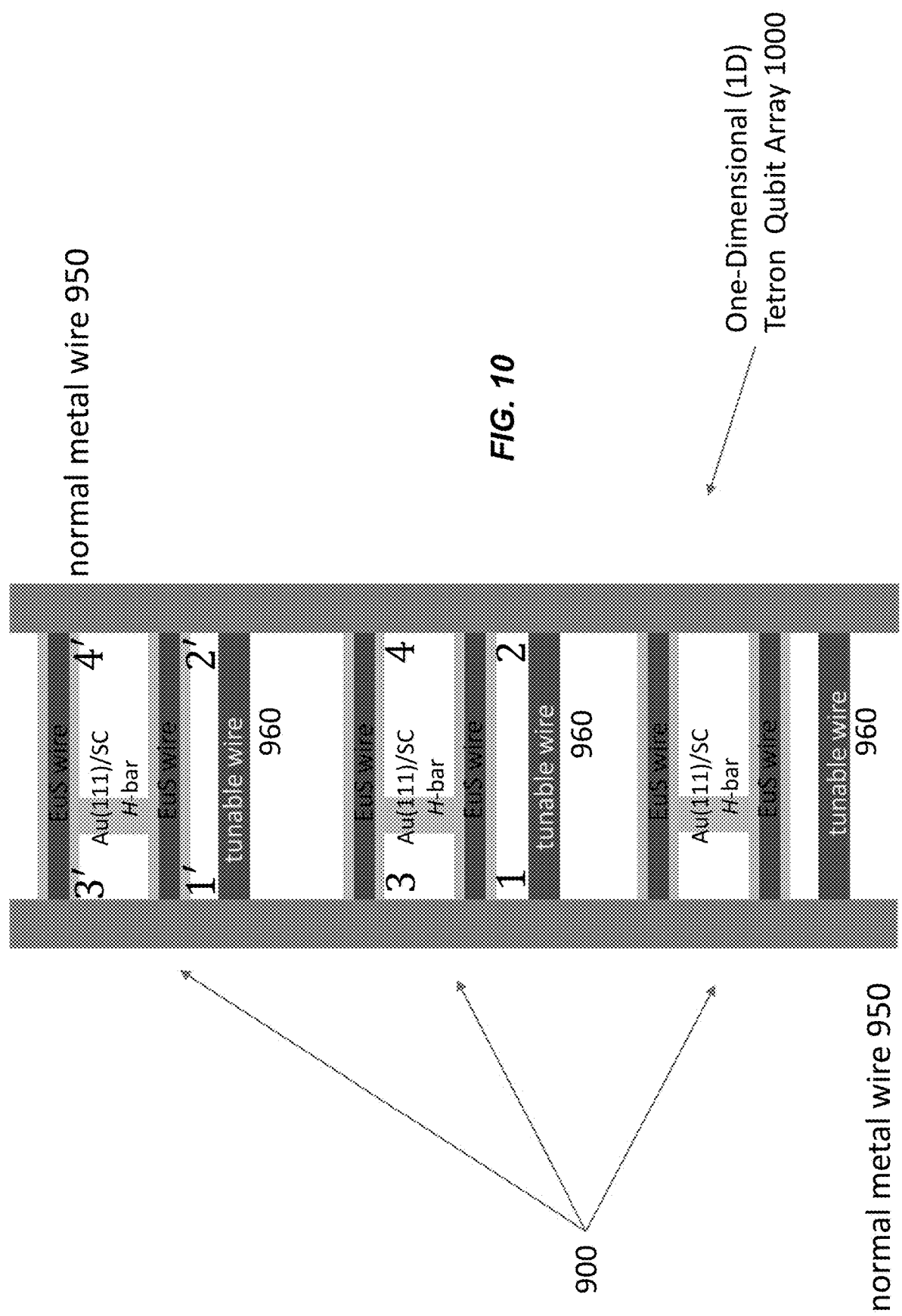

FIG. 10 illustrates a one-dimensional (1D) tetron qubit array.

Figure 11:
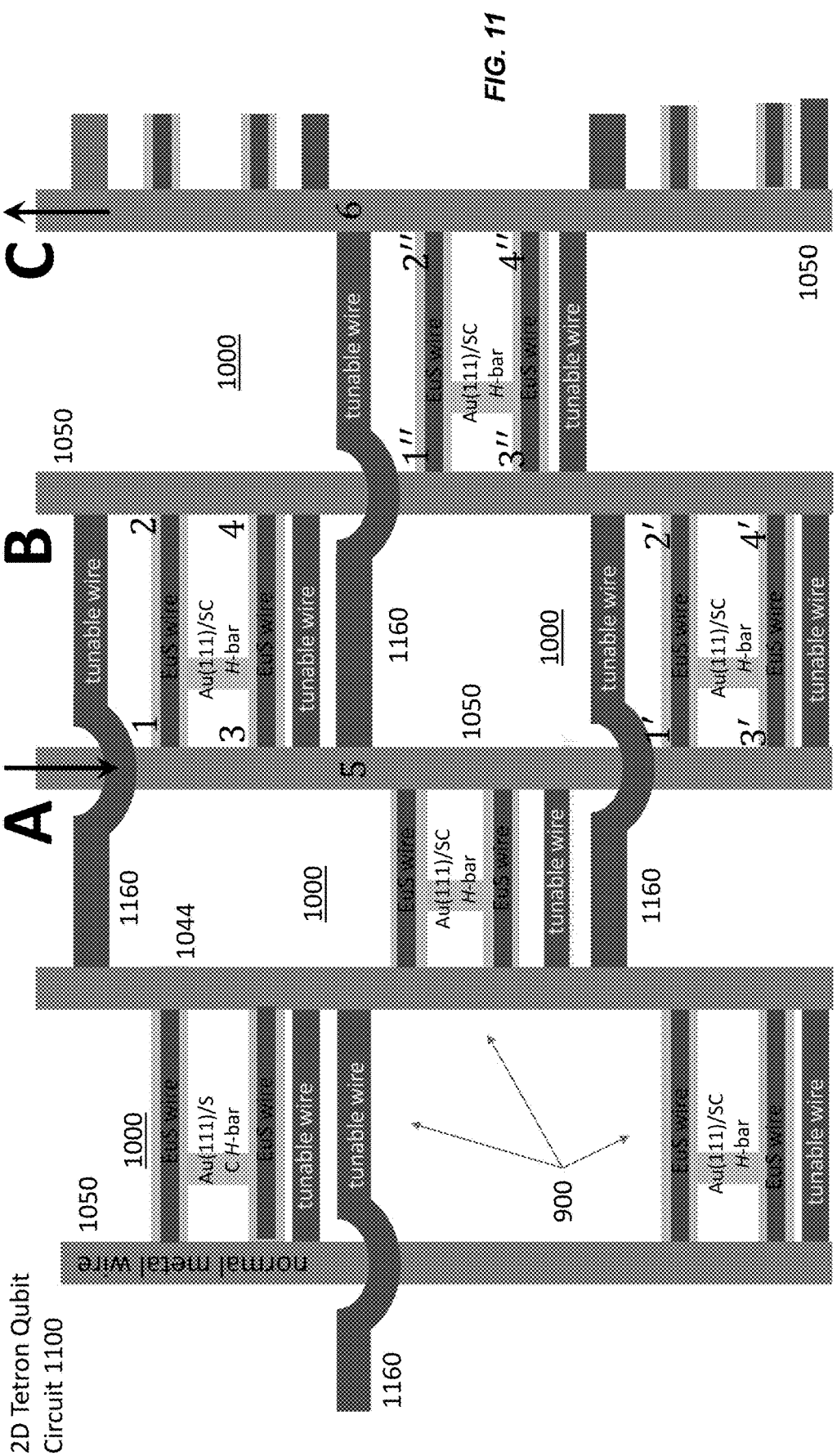

FIG. 11 shows a 2D tetron qubit circuit.

Figure 12A:
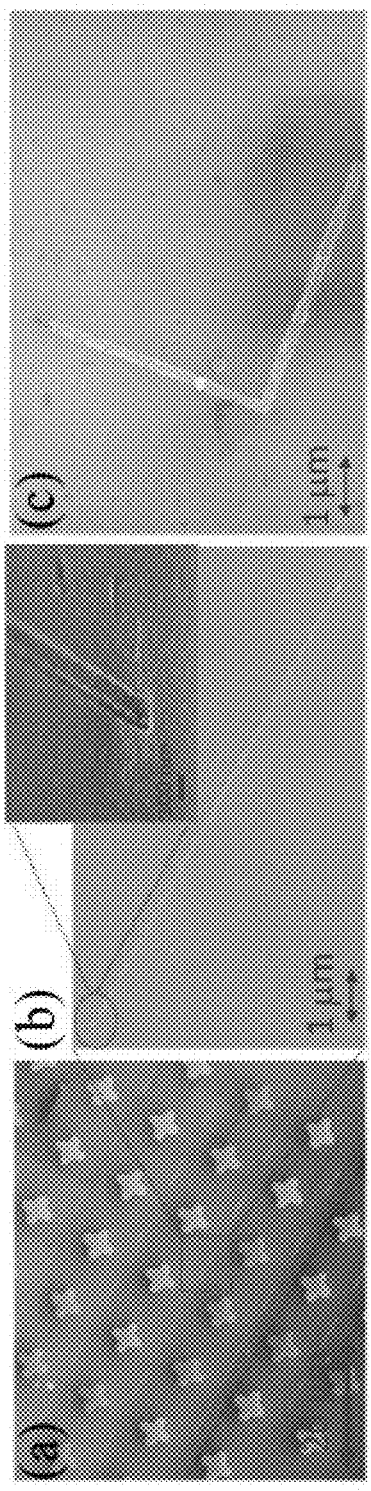

FIG. 12A is a scanning electron microscope (SEM) image of an array of Au(111) nanowires. Each nanowire sits in a square area with four alignment marks (cross) at the corners.

Figure 12B:
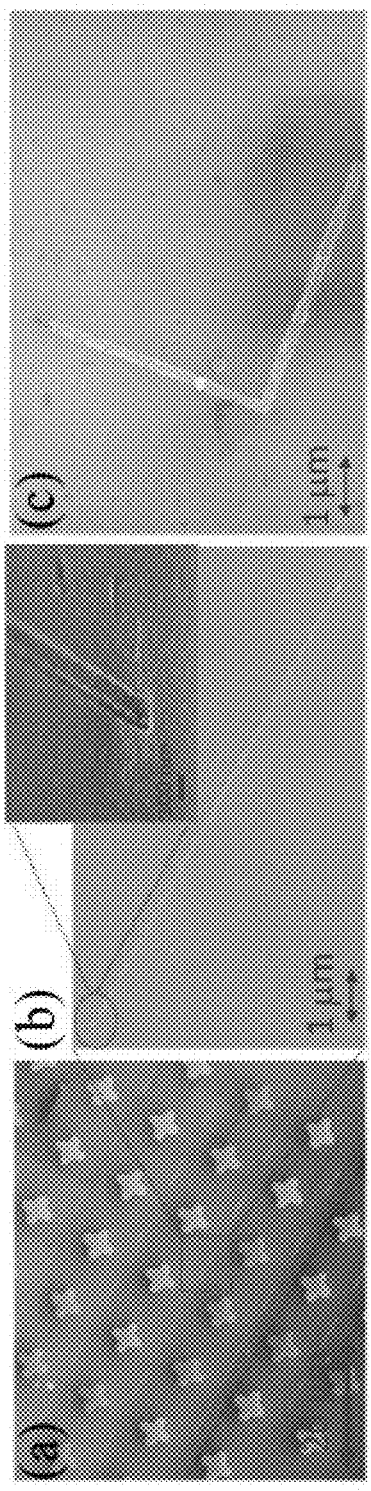

FIG. 12B shows a zoomed-in SEM image of the region marked by the square in FIG. 12A. The inset shows an even further zoomed-in SEM image of the nanowire array.

Figure 12C:
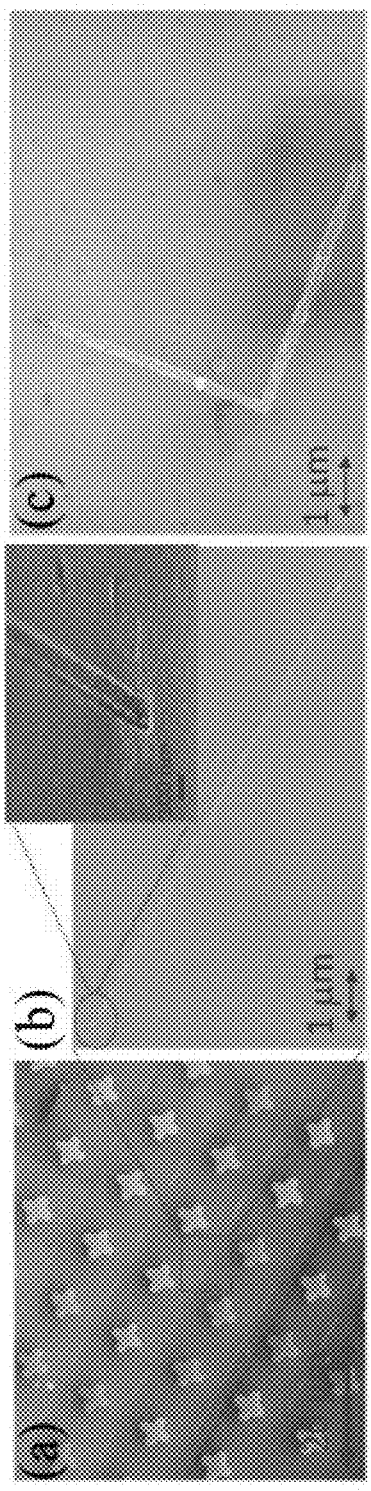

FIG. 12C shows an SEM image of an "L" shaped nanowire.

Figure 12D:
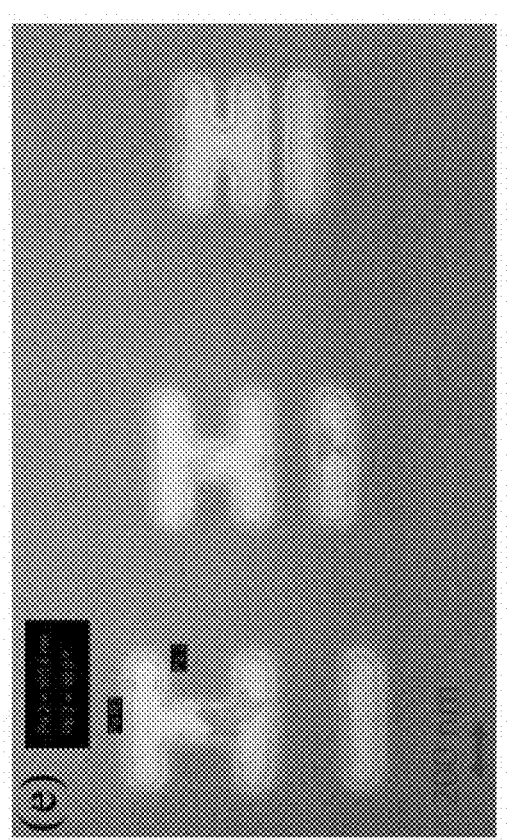

FIG. 12D shows an SEM image of a patterned array of a H-shaped "tetron" structure for MZM qubits. The inset shows a typical unit of such array.

Figure 12E:
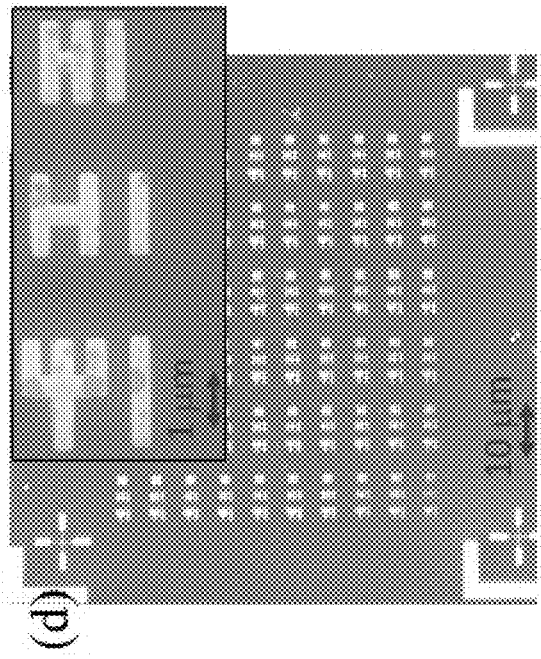

FIG. 12E shows an SEM image of a patterned "H" bar structure for MZM qubits. The dark regions in FIGS. 12D and 12E are solvent residues left during the nanofabrication, which can be easily removed by following standard cleaning procedures.

DETAILED DESCRIPTION

Signatures of MZMs in the form of zero bias peaks (ZBP) can be observed in a platform based on the surface state of gold. This metal-based heterostructure platform holds a number of advantages over other platforms. First, there is a wealth of experience in epitaxial growth of noble metals on a variety of superconductors, as well as epitaxial growth of ferromagnetic insulators on top. Second, lithographic methods to produce large arrays of increasingly complex designs are well developed. Third, the energy scales in a metal are generally high compared with those of semiconductors. Fourth, this metal-based heterostructure platform can be used in a topological qubit for a quantum computer as explained below.

Simply using the surface state of gold by itself (i.e., without the magnetic insulator) to generate an MZM pair as proposed previously has a serious limitation. The bottom of the surface state band lies about 500 meV below the Fermi level. For a 100 nm wide Au(111) wire, this means that there are approximately 100 transverse sub-bands crossing the Fermi level. Simulations show that the topological state is extremely delicate under such condition, and it is unlikely that the MZMs have detectable signals. Another limitation of using the surface state of Au(111) by itself is the need for a large parallel magnetic field to overcome the induced superconducting gap, which is much larger compared to platforms based on semiconductor with large g-factors.

Fortunately, adding a ferromagnetic insulator on top of the gold film dramatically lowers the Fermi level of the gold film's surface state. In addition, the ferromagnetic insulator induces a sizeable magnetic exchange field in the gold film, making it possible to reduce the amplitude of the applied magnetic field H.

A Metal-Based Heterostructure Platform for Generating MZM Pairs

FIG. 1A shows a metal-based heterostructure platform 100 for generating MZM pairs. This platform includes a substrate 100 that supports a conductive film—shown as a (111)-gold (Au) nanowire 130—between a superconducting film 120 and a ferromagnetic insulator 140. This platform 100 is based on the Shockley surface state of the conductive film, which has a free (upper) surface whose Rashba spin-orbit splitting/energy is greater than 1 meV (e.g., about 110 meV, which is the Rashba spin-orbit splitting/energy for gold). (In contrast, the Rashba spin-orbit splitting/energy for existing semiconductor platforms is about 100 μV or less.) This is readily realized here by the (111)-Au nanowire 130 with induced superconductivity, as proposed theoretically several years ago. This conductive film can also be made of (111)-silver (Ag), platinum, bismuth, or another noble metal. Au(111) is especially useful because its surface state has a large Rashba spin-orbit coupling (SOC) energy scale, leading to a splitting of 110 meV, which is several orders of magnitude larger than those in semiconductor nanowires.

The conductive film is shown as an Au(111) nanowire 130 grown on top of a superconductor 120 (e.g., vanadium (V), niobium, titanium, tin, aluminum, gallium, or an alloy or compound thereof with nitrogen, germanium, or silicon), which in turn is on a substrate 110. The substrate 110 can be any inert material with a clean, flat, and smooth surface enabling the epitaxial growth of high-quality superconductor of the desired crystalline orientation. Suitable substrate materials include sapphire, silicon, diamond, glass, gallium arsenide, mica, and such. For proximity coupling to the superconductor 120, the gold nanowire 130 should be within 1 nm of the superconductor 120 and may be in direct physical contact with the superconductor 120. In general, the superconductor should have as high a critical temperature as possible (e.g., at least 4 K). Higher critical temperatures correspond to higher energy gaps, which in turn create larger fields and more stable Majorana signals. The gold nanowire 130 becomes superconducting due to the proximity effect. The bulk gold in turn induces a pairing gap on the surface state.

FIG. 1B is a plot of the schematic surface state Rashba split band structure, which is isolated from the projected bulk bands, for the structure shown in FIG. 1A. The position of the bottom of the surface band ($E_{SS}$) can be tuned by varying the thickness of the EuS coverage. In the platform of FIG. 1A, the surface state has an energy gap of 0.38 meV, distinct from the bulk gold gap, which is 0.61 meV.

By using planar tunneling devices instead of a scanning tunneling microscope (STM), the measurement can be carried out at a temperature that is one order of magnitude lower and thus finer energy resolution should be possible. With such setups a larger magnetic field can be applied, which allows the use of superconductors with large gaps, resulting in larger topological gaps. Larger topological gaps are especially beneficial because the topological gap should be much larger than thermal excitations (due to temperature) in order to suppress thermal excitations for coherent MZM manipulations.

The ferromagnetic insulator 140, shown in FIG. 1A as an epitaxial film of EuS, is grown on the top of the gold nanowire 130 to magnetize the gold surface state via exchange coupling. The magnetic insulator can also act as a gate dielectric for a separate gate electrode (not shown). Applying a magnetic field H along the long axis of the nanowire 130 with a magnetic field source, such as a magnet or electromagnet (not shown), creates MZMs 101a and 101b (collectively, an MZM pair 101) at opposite ends of the nanowire 130.

More generally, the ferromagnetic insulator 140 can be formed of any magnetic insulator that can provide exchange field (e.g., EuS, EuO, GdN . . . ). It can be between two and twenty monolayers thick (e.g., at least two monolayers of EuS). Thinner layers naturally form islands, as shown in FIG. 1A and may exhibit magnetic bistability, whereas thicker layers can be patterned. For example, the magnetic insulator 140 can take any shape, such as a star-shaped island, diamond-shaped island, or wire. The wires can be connected to form various shapes, such as N or H shapes with multiple ends. Magnetic fields along the shape's pointy ends or corners determine where the MZMs 101a and 101b form, enabling spatial multiplexing for logic or memory. If the magnetic insulator 140 has more than two corners or pointy ends, it may be possible to form several MZM pairs 101 simultaneously or to form MZM pairs 101 at different pairs of corners or points.

A scanning tunneling microscope 190 detects the ZBPs associated with the MZM pair 101 at opposite ends of the gold nanowire 130. If desired, electrical leads ending with a tunnel junction (not shown) can be coupled to the ends or corners of the magnetic insulator 140 for detecting the presence or absence of ZBPs. In this case, there can be an inert protective layer (not shown) over the magnetic insulator 140, with portions exposed for the electrical leads, which can be coupled to electronics (e.g., a transistor) packaged with the platform 100 and covered with a protective layer.

The conductive film can be a complete (unpatterned) sheet. It can also be patterned into a wire, as in FIG. 1A, or another shape. FIGS. 1C and 1D show a nanolithographically patterned array of (111)-Au wires formed from epitaxially grown thin film layers. The wires are 4 nm thick, approximately 100 nm or less wide, and microns in length. FIG. 1C shows that the Au(111) wires are highly crystalline with sharp edges.

FIG. 1E is a plot of a scanning tunneling spectroscopy (STS) spectra, which shows clearly that a hard superconducting gap is induced in the Au(111) wire from the vanadium underneath. The Au(111) wire is homogeneously in contact with the vanadium layer sharing a high-quality interface that is made under ultra-high vacuum environment. The STM and STS measurements were performed in an ultra-high vacuum STM with an RHK PanScan head integrated in a Janis 300 mK He3 cryostat with a 5 T vector magnet. The STM was equipped with a rotating flange that allowed a precise rotation of the scanning head with respect to the magnet of the cryostat, making it possible to align the applied magnetic field with the Au nanowire. Tunneling spectroscopy measurements were taken using a standard lock-in technique at 937 Hz frequency and bias modulation voltages of $V_{mod}$=80-120 μV (RMS value).

EuS Island Geometry and Behavior

FIGS. 2A-2D illustrate the geometry and behavior of two monolayers (MLs) of EuS deposited on an array of Au(111) nanowires. FIGS. 2A-2C are STM topography images of the Au(111) nanowire array at different scales, with FIG. 2A having the lowest magnification and FIG. 2C having the highest magnification. FIG. 2C shows a single EuS island, with an arrow indicating the applied magnetic field H from a magnetic field source (not shown) and eight measurements positions 1-8 around the circumference of the EuS island. This EuS island is about 30 nm wide and 25 nm long and sits completely on one Au(111) nanowire. FIG. 2D shows the tunneling spectra (dI/dV vs $V_{bias}$) over large bias voltages on both the bare Au(111) surface (lower traces) and the EuS island (upper traces). The traces are shifted vertically for clarity.

Comparing the STS spectra in FIG. 2D for the bare Au(111) surface and the two-monolayer EuS island shows that two monolayers of EuS deposited on an Au(111) wire shifts the bottom of the surface state band to only about 30 meV below the Fermi level. The STS peaks marked by arrows are the signatures of the band bottom of the surface state, characterized by a square root singularity of the density of states. The STS peak of the pristine Au(111) nanowire surface is about 420 meV below the Fermi energy, consistent with the values reported by angle-resolved photoemission spectroscopy (ARPES) and STS. Here, the chemical potential μ is the energy difference between the Fermi level and the crossing point of the Rashba bands, which lies 15 meV above the band bottom. Two monolayers of EuS place the chemical potential μ at about 15 meV. This means that for a 100 nm wide wire, only about five transverse sub-bands cross the Fermi level, so the conditions for creating MZMs are much more favorable.

If a middle segment of the Au(111) wire is completely covered by EuS, two MZMs should emerge underneath the ends of the EuS if a magnetic field H is applied by a magnetic field source parallel to the wire. A continuous EuS layer can be grown to completely cover the surface of an Au(111) wire. Planar tunnel junctions can be used to tunnel through a continuous EuS layer for MZM measurements. When the EuS layer is thin (e.g., two to ten monolayers thick, or at least 1 nm to 2 nm thick, depending on the area), EuS islands form on the Au(111) wire as shown in FIGS. 2B and 2C. These EuS island are uniformly two monolayers thick. High-resolution STS measurements can be obtained by tunneling into the exposed Au(111) surface regions in the vicinity of a EuS island (e.g., about 2 nm away from the island edge) as shown in FIG. 1A. If MZMs emerge underneath the EuS island, the STM tip can couple to the MZMs due to their spatial decay. The spatial decay length may be about 8 nm, which extends well past when probing within 2 nm away from the island's edge.

FIGS. 3A-3D show that ZBPs emerge inside the pairing gap when the applied magnetic field exceeds a certain value. They are plots of tunneling spectra taken at the eight positions around the EuS island in FIG. 2C. At zero field, the dI/dV spectra demonstrate a hard superconducting gap, which does not change regardless of where the STS is taken. These results demonstrate a uniformly induced superconductivity in Au(111), and the shape of the EuS island has no effect on the induced gap. With 4.8 T magnetic field applied along the wire (called the north-south direction), ZBPs appear in positions 1, 2 and 3 near the north side of the island and near position 6 on the opposite side as shown in FIG. 3B. In between these positions, the tunneling spectra remain largely unchanged except for a small filling in the gap due to the applied magnetic field as shown in FIG. 3A.

FIG. 3C is a 2D density plot of STS data with a fine scan of the magnetic field near position 6 in FIG. 2C. This 2D density plot shows the evolution of the gap and the ZBP, i.e., it shows a topological transition characterized by the closing of the superconducting gap and the emergence of ZBP beyond a critical magnetic field value of about 3.6 T for this example. FIG. 3D is a plot of the corresponding line scans, which show that the superconducting gap evolves from "U" to "V" shape over a transition region with a width of about 0.6 T before the gap is filled in and the ZBP emerges as the amplitude of the applied magnetic field increases. These features closely resemble the topological transition in the theoretical model of a multi-mode system described below.

The width of the ZBP is about 0.2 meV, about a factor two larger than $\pi k_B T$ that is expected for the temperature of 0.38 K. The width is limited by the instrumental resolution due to the bias modulation voltage needed to achieve a signal with a sufficiently low noise. Therefore, it is possible that the ZBP is due to a pair of hybridized MZMs that give a pair of unresolved split peaks. In fact, such splitting is to be expected for an island that is so small.

FIGS. 4A-4G illustrate the geometry and behavior of a more rectangularly shaped EuS island (60 nm×45 nm) with an edge that overlaps the edge of an Au(111) wire in an Au(111) nanowire array. FIG. 4A shows the nanowire array, FIG. 4B shows the EuS island and measurement positions, and FIG. 4C shows a closeup of the center of the EuS island. The EuS island has excellent crystalline quality as can be seen from the atomically resolved scanning tunneling microscope (STM) image in FIG. 4C.

FIGS. 4D-4G show STS spectra at different positions around the island under different applied magnetic field strengths. In each case, the magnetic field is parallel to the Au(111) wire. Again, FIG. 4D shows uniform and fully gapped spectra at zero field. In a 4.8 T field, two ZBPs appear on the opposite sides of the EuS island at positions 1 and 8, where the island intersects the edge of the gold wire, as shown in FIG. 4E. At positions 2-7, the superconducting gap spectra remain unchanged at magnetic fields above 0 T except for a slight filling of the gap. Apparently the wavefunctions corresponding to the ZBPs are strongly localized along the intersected edge of the EuS island and the gold nanowire, rather than spread out along the upper and lower edges of the EuS island. (This observation is also found in the simulations discussed below and shown in FIG. 5A.) The localization of the MZM is sensitive to the local environment, such as steps in the chemical potentials at the edge of the gold wire, thus accounting for the strong localization in this case.

FIGS. 4F and 4G show the evolution of the ZBPs at positions 1 and 8, respectively, as a function of the magnetic field H applied by a magnetic field source (not shown). At both positions, the gap fills in when the applied magnetic field is around 3.5 T, which agrees well with the onset of ZBPs in the other island shown in FIG. 3C. The ZBP appears at comparable threshold magnetic fields for position 1 (at about 3.5 T) and for position 8 (at about 4 T). The slightly different threshold magnetic fields may be a result of the broad transition region as seen in FIG. 3C. In FIG. 3C, the transition takes place at around 3.5 T but has a blurred region with a span of the magnetic field of more than 0.5 T.

Without being bound by any particular theory, a sharp threshold field and the emergence of MZMs simultaneously at exactly the same threshold field are not expected under the experimental conditions in FIGS. 4A-4G for two reasons. The first reason is that unlike the quantum wire case, this a multi-mode situation. As explained below and supported by simulations shown in FIGS. 6A-6D, the gap closing and the emergence of the MZM take place rather gradually due to a multitude of low-lying states near the threshold. The second reason has to do with quasi-particle poisoning due to excitations above the topological gap (see FIG. 5B, described below), which is defined as the energy of the lowest extended quasi-particles state. This gap closes at the topological transition and re-opens at higher fields, so that just above the transition, there should be a large poisoning rate $\Gamma_p$. The weight of the ZBP is reduced by the factor $\Gamma/(\Gamma+\Gamma_p)$ where F is the tunneling rate. Since F is very small for STM tunneling, a large reduction of the ZBP weight is expected near the topological transition at around 3.5 T. The weight gradually increases as the topological gap reopens and $\Gamma_p$ is reduced. Since the tunneling and poisoning rates depend on the local details near the location of the MZM, the visibility and the onset magnetic field of each MZM partner is expected to have some variation, consistent with FIGS. 4F and 4G.

Numerical Simulations of EuS Islands on Au(111) Wires

Numerical simulations on realistic models of the Au(111) wire partially covered by EuS islands of different sizes support this interpretation. The numerical simulations were performed on a square lattice with hopping and Rashba energies chosen to match the band structure of the gold surface states. The chemical potential can be reduced and the effective Zeeman energy $V_x$ can be enhanced under the EuS island. The coupling between the surface state and the bulk gold states is considered with a self-energy correction. When the chemical potential under the EuS island is less than 30 meV, the MZMs exist over a large fraction of the chemical potential range with a relatively large gap to other sub-gap excitations, so that the chance of finding robust MZMs is quite high.

FIGS. 5A-5D show the distribution and spectra of the wave function for an EuS island that is 60 nm×60 nm and overlaps the edge of the gold wire. Under the island the chemical potential μ=25 meV and the effective Zeeman energy is $V_x=2\Delta_B$. FIG. 5A shows that the MZM wave functions are strongly localized at the corners of the intersected edge, in excellent agreement with what is seen experimentally in FIGS. 4A-4G. In contrast, for a rectangular shaped island that is in the middle of a gold wire and removed from the edge, the MZM wavefunctions spread out along the north and south edges. The MZM wavefunction can be trapped by a spatial inhomogeneity, such as the proximity to a step in the chemical potential near the edge of the gold wire.

FIGS. 5B, 5C, and 5D show simulated tunneling spectra at T=0, and T=350 mK, and T=700 mK, respectively. The tunneling spectra were taken at a point near the edge just outside the EuS island, showing a ZBP due to an MZM. The 700 mK in FIG. 5C mimics the additional instrumental broadening and can be compared with the experimental curves shown in FIG. 5E. The split peak near zero bias in FIG. 5B is due to the overlap of the MZM localized at opposite ends of the islands. In addition, there are in-gap states which typically start at energy of $0.1\Delta_B$. Thermal smearing picks out these states as sidebands and background, as shown in FIGS. 5C and 5D.

The numerical simulation in FIG. 5A also shows that the decay length of the MZM perpendicular to the edge towards the middle of the wire is very short. This explains the surprising fact that ZBP were observed for islands as small as 30 nm in diameter. Without being bound by any particular theory, the coherence length appears to be short for two reasons. First, the Fermi velocity is very small because the last filled sub-band has a very small Fermi energy. Second, this situation is similar to what is observed in an Fe atomic chain, where the wavefunction leaks into the substrate, reducing the spectral weight and the velocity, thereby reducing the effective coherence length. In fact, this leakage is needed to produce a surface superconducting gap close to the bulk superconducting gap $\Delta_B$.

The numerical simulation assumes an exchange field under the EuS island in addition to the applied magnetic field. Without this exchange filed, a magnetic field large enough to drive the system to a topological regime also closes the superconducting gap outside and destroys the MZMs. In EuS, the magnetic moment normally lies in-plane, but on certain surfaces EuS develops a canted magnetization with a large out-of-plane component due to spin-orbit coupling. In this case, the increasing applied parallel magnetic field enhances the Zeeman field along the nanowire due to the canting of the magnetic moment. However, the precise orientation of the magnetic moment is not known.

FIG. 6A-6D illustrate numerical simulations of a EuS island that is 60 nm×300 nm overlaps with the edge of an Au(111) nanowire that is 120 nm wide. The energy splitting of the MZM is small and well separated from the higher energy states.

FIG. 6A shows the lowest 25 eigenvalues as a function of the effective Zeeman energy $V_x$. The gap defined by the lowest excited state closes at $V_x=1.10\Delta_B$ and reopens, leaving behind a pair of split MZMs. The topological gap that re-opens is about $0.2\Delta_B$. A large number of states come down in energy as the gap closes, and a large number of states lie above the topological gap that re-opens. Consequently, the contribution of an individual state to the tunneling conductance is very small. In the single-mode case, fewer states come down as the gap closes, depending on the sample length; for short wires, there may be only one state that comes down as the gap closes. As a result, the gap closing as the topological state is approached can be seen both in experiment and simulation in short nanowires. In contrast, the lowest state in FIG. 6A that leads to gap closing as the threshold is approached contributes only a small amount to the tunneling conductance.

FIGS. 6B, 6C, and 6D show STS spectra taken at temperatures of 0 mK, 350 mK, and 700 mK at a point halfway between where the ZBP appears and the edge of the EuS island. In FIGS. 6B and 6C, the tunneling spectra taken near the edge just outside the EuS are shown at T=0, 350 mK, and 700 mK. The T=0 mK spectra in FIG. 6B, the gap closes as $V_x$ approaches the threshold. The lowest excited state carries a very small weight and is hardly visible. Above the threshold, the MZM appears as a double peak split by the overlap in a finite size island. At the same time, the topological gap develops, increasing to $0.2\Delta_B$ consistent with FIG. 6A. However, a large number of states appear above the topological gap. Further examination shows that some of these states are extended, while others are localized near the ends of the wires, with a wavefunction very similar to that of the MZM. These states can be interpreted as "Majorana descendants," a feature of the multi-band system.

Upon thermal averaging, FIG. 6C shows that at 350 mK the gap closing is indicated by a rather subtle filling in of the gap and the MZM gradually becomes visible above the threshold effective Zeeman field. The combination of extended states and Majorana descendants give rise to the sidebands of the MZM peak. In the right panel of FIG. 6C, the 700 mK curves simulate the effect of additional instrumental broadening and can be compared with the measurements in FIGS. 4F and 4G. FIG. 6D shows tunneling spectra taken at a point at the middle of the wire just outside the EuS boundary. Only the extended states contribute. The gap closing and re-opening is hardly observable and is consistent with the data in the lower panel of FIG. 4D.

To rule out the possibility that the ZBP is due to conventional Andreev bound states that happen to stick to zero energy and not an MZM pair, consider the following. There are two possible sources of such Andreev bound states, depending on whether disorder is present. In the absence of disorder, if the end of the wire is subject to a smooth potential, even in the non-topological region a pair of MZMs are often found near the end that are weakly hybridized with each other. One of these could couple strongly to the outside lead, giving a tunneling conductance that resembles that of a true MZM. The reason for the lack of hybridization is that the two states may have different spins or momenta and are therefore almost orthogonal. Such smooth potentials are generic in the semiconductor wire set-up because the tunnel barrier is created by gating. Here, however, the wire and the island terminate abruptly on an atomic scale and the tunnel barrier is via an STM tip, so it is unlikely that the ZBP is due to weakly hybridized MZMs.

A second false signal source is a localized Andreev bound state that happens to have energy near zero and is produced accidentally by a disorder potential. However, such a localized Andreev bound state usually requires fine-tuning of the parameters. Furthermore, it is equally likely to find such a localized state anywhere along the boundary of the island. This is in contrast to measured ZBPs, which are aligned with the applied magnetic field and do not appear in zero or finite field anywhere else.

Finally, there is no reason why these Andreev bound states should appear at two areas on opposite sides of the same island at a similar magnetic field. The appearance of ZBP's in the EuS islands is not a rare occurrence. Of 60 islands observed under varying experimental conditions, 20 islands exhibited ZBPs that are always located either near the north or south shore with respect to the magnetic field. The observed spectra were either fully gapped or exhibit ZBPs and we never find split peaks that may be associated with Andreev bound states. And out of these 20 islands, there were 4 islands with a pair of ZBPs at opposite ends. In any event, since there was no control of the chemical potential, simulations suggest finding MZM less than 50% of the time, which is consistent with experimental results.

Simulations also show that an EuS island in the middle of a wider Au wire and away from the edges can also support MZMs, even though the wave function may spread out more along the edge of the island and thus can be harder to detect with STM. Without being bound to any particular theory, this explains the observation of ZBP localized on the edges of the islands shown in FIGS. 2C and 3C. This indicates that depositing EuS wires on a large area of Au allows even greater freedom in designing more complicated structures, including the MZM-based topological qubits described below.

MZM-Based Qubits for Quantum Computing

An array of MZM-based qubits can form the basis of a quantum computer. Such an array uses the measurement-based scheme that was proposed by Bonderson, Freeman and Nayak, Phys. Rev. Lett. 101, 010501 (2008), which is incorporated herein by reference in its entirety. This measurement scheme involves measuring the fermion parity $P_{ij}=i\gamma_i\gamma_j$, where $\gamma_j$ is the Majorana operator of MZM located at site j The fermion parity takes on the value +1 or −1, depending on whether the fermion corresponding to the pair i,j is occupied or empty.

Here, four MZMs are used to form a qubit. In general, the MZMs can exist at the pointy ends of a region of topological superconductors, in this case formed out of EuS deposited over Au surface states and proximity coupled to a superconductor. One possible configuration is shown in in FIG. 7A, where the EuS is formed into an N-shaped wire 841, with tunnel junctions 842 to probe the MZMs forming at the four corners of the N. The entire N-shaped array is electrically isolated to form a Coulomb blockade island to keep the total charge on the island fixed. This can be accomplished by cutting along the dashed line with a focused ion beam, for instance.

FIG. 7B shows another example of a qubit comprising MZMs on a Coulomb blockade island, called a tetron 700. (For more on tetrons, see, e.g., Karzig et al., Physical Review B 95, 235305 (2017) or U.S. Pat. No. 10,346,348, which are incorporated herein by reference in their entireties.) The tetron 700 is shaped like an H and hosts an MZM at each tip (denoted in FIG. 7B by the respective Majorana operators. One difference between the N-shaped wire in FIG. 7A and the H-shaped tetron 700 in FIG. 7B is that the cross wire of the H can be a conventional superconductor, as long as its length is short compared with its coherence length. The total parity $P_{13}P_{34}$ of the qubit is fixed by the Coulomb energy. The two states of the qubits are determined by $P_{12}$ if 12 are chosen as the basis. The Pauli operator $Z=P_{12}$. The other independent combinations give the other two Pauli operators, $X=P_{14}$ and $Y=P_{13}$. The H-shaped tetron is advantageous for semiconductor nanowire-based qubits because the cross wire is a conventional superconductor, making it possible to avoid the difficult step of fabricating cross nanowires. However, the metal-based heterostructure platform disclosed here offers greater flexibility in fabrication, so that a variety of geometries, including the N-shaped array in FIG. 7A, can be used instead.

For a qubit array, each qubit should be entangled with a neighboring qubit (denoted by ') by measuring two pair of Pauli operators, such as ZZ' and XX', which are proportional to the joint probabilities $P_{12}P'_{12}$ and $P_{14}P'_{14}$, respectively. With these measurements, it is possible to perform the complete set of Clifford operations on the qubit array which cover the set of all topologically protected operations.

The operating principle of the qubit is that the teleportation of an electron can take place through two tunnel junctions (located at 1 and 4, for instance) via the MZMs 1 and 4 with a net transmission amplitude $T_{14}$, which is independent of the distance between the junctions, but which is proportional to the joint parity $P_{14}=i\gamma_1\gamma_4$. The independence of the transmission on distance is a consequence of the nonlocal nature of MZMs and has been called "teleportation." An illustration of teleportation is shown in FIG. 8A.

FIGS. 8A-8C illustrate the building blocks of an MZM-based qubit in an Au/EuS platform. In FIG. 8A, a patterned EuS wire 840 on an unpatterned Au(111) sheet 830, which in turn is on a superconducting film 820 (FIG. 8B). The Au film 830 and the superconductor 820 underneath should be electrically isolated to form a Coulomb blockade island in order to fix the total electron number on the island. This can be accomplished with the use of a focused ion beam, for instance. The Coulomb island is outlined by the dashed line in FIG. 8A but not shown in FIG. 8B to avoid cluttering. Tunnel leads 842 connect to opposite ends of the EuS wire 840 for detecting MZM pairs. If desired, a top gate 844 can be deposited on the EuS wire 840 to modulate the Fermi level of the surface states in a local region in the Au(111) film 830 with an electric field E orthogonal to the plane of the Au(111) film 830 as shown in FIG. 8B. In this case, the EuS wire 840 as well as a possible additional dielectric 846 serves as a gate dielectric between the top gate 844 and the conductive Au(111) sheet 830. This electric field E can fine-tune the chemical potential of the surface state electrons on the gold wire to optimize the stability of the MZM. In addition, by placing the gate close to one end, the electric field E can move the MZMs away toward or away from the tunnel junctions 842, enabling selective tunneling into any pair of MZMs.

FIGS. 9A-9D illustrate an example of MZM-based qubit 900. In this device, EuS wires 940 are formed on a H-shaped Au(111) layer 930, which in turn is on a superconducting film supported by a substrate (not shown) forming a Coulomb island. The charge on the Coulomb island is controlled by a side or bottom gate 946. Top gates 944 push the MZMs towards or away from the ends of the H-shaped Au(111) layer 930, where they can be measured by respective tunneling junctions 942 coupled to the ends of the H-shaped Au(111) layer 930. Normal wires 950 parallel to the bridge of the "H" conduct current to and from the tunneling junctions 942

The metal-based heterostructure platform leads to setups that differ from conventional tetrons in several ways. First, its shaped is not limited to an H-shape. It can be formed in a variety of geometries, including the N-shaped configuration shown in FIG. 7A. Second, in order to connect to the MZM, the earlier proposal uses a semi-conductor wire with a gate tunable constriction to tunnel to the MZM from a lateral direction. This method is not feasible in a metal-based heterostructure platform. Instead, the metal-based heterostructure platform uses metallic leads and a tunnel junction to tunnel from the top, as shown in the inset in FIG. 8A. Third, while the junction itself is not tunable, the top gate 944 can move the MZM away from the junction, thereby selectively tunneling to a given MZM.

Adding a wire 960 parallel to the tunnel junctions 942 with transmission amplitude $T_0$ creates an interference loop so that that total current I is proportional to $|T_0+T_{14}|^2$. The interference cross term gives a change in the current which is proportional to the joint parity $P_{14}$. This interference arm 960 can be made of a material that responds to electromagnetic fields, such as highly doped semiconductor, graphene, topological insulator, phase change/ferroelectric materials, polymers and such, so that its resistance is gate tunable.

This qubit 900 exploits the ability to move MZMs towards and away from the tunnel junctions 942 on and off with the top gates 944, making it possible to select the particular pair of MZMs to be measured. As noted above, the location of the MZM is very sensitive to the potential seen by the surface state, which is controlled by the electric field of top gate 944. Each top gate 944 can change this potential individually and move the MZM away from the corresponding tunnel junction 942, enabling selective tunneling into any pair of MZMs.

Figure 9B:
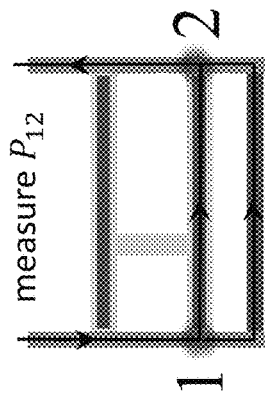
Figure 9C:
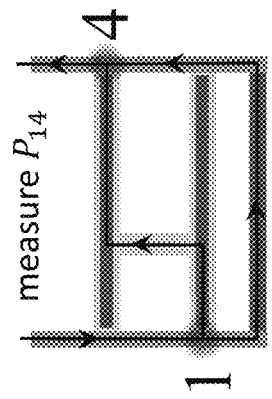
Figure 9D:
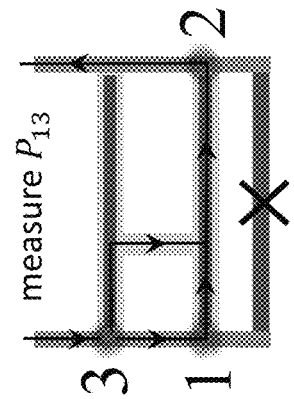
Figure 9A:
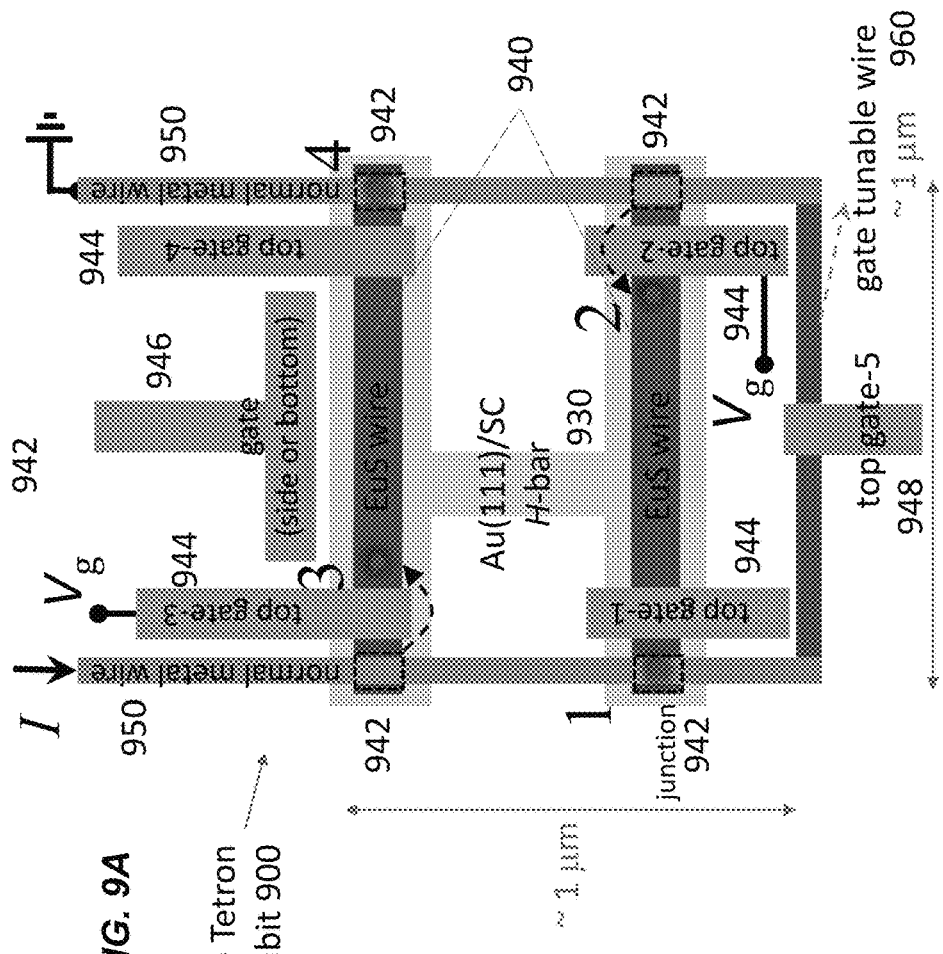

By turning on the junctions 942 at 1 and 2 the fermion parity $P_{12}$ of this pair can be measured as shown in FIG. 9B. Similarly, the fermion parity $P_{14}$ can be measured as shown in FIG. 9C. These measurements of $P_{14}$ and $P_{12}$ correspond to the Pauli operators X and Z, respectively. In the presence of a small magnetic field perpendicular to the plane, the interference gives rise to Aharonov-Bohm oscillations in the conductance as a function of the field, which have distinct phases corresponding to each specific value of the parity of the pair 1, 2 and 1, 4 in FIGS. 9B and 9C, respectively. A measurement of the phase change indicates the parity state of the MZMs pair. However, it suffices to do the measurement in zero field and look for the jump-in conductance for different values of the fermion parity In order to measure $P_{13}$, the interference arm (the tunable wire 960) is turned off and the tunnel junctions 942 at locations 1, 2, and 3 are turned on as shown in FIG. 9D. The current paths that are "teleported" through junctions 32 and 12 will interfere, so that the current is proportional to $|T_{32}+T_{12}|^2$. The cross term is proportional to $P_{32} P_{12} = -\gamma_3\gamma_2\gamma_1\gamma_2 = -\gamma_3\gamma_1$, which is proportional to $P_{13}$. (In the last step, recall that $\gamma_2\gamma_2=1$) In this way the parity $P_{13}$ is measured. This measurement corresponds to the Pauli operator Y and completes the set of Pauli operators X, Y, and Z on the qubit 900.

Again, the gate tunable wire 960 serves as the parallel interference arm for the measurements disclosed above. This wire 960 can be constructed out of doped semiconductor or other materials as described below. A top or side gate 948 changes the resistance of this wire. The resistance can be tuned to optimize the ratio of the signal to background (the ratio $|T_{14}/T_0|$) as well as to achieve a sufficiently large $|T_0|^2$ so that the current can be measured with enough accuracy. (For a semiconductor lead with N channels, $T_0$ should be treated as an N by N matrix. In this case, the signal-to-background ratio is reduced by an additional factor of $\sqrt{N}$). For the operation of the qubit circuit described below, it is useful to be able to turn on an individual wire 960 using the gate.

FIGS. 10 and 11 show a one-dimensional qubit array 1000 and a two-dimensional qubit circuit 1100 made of the qubits 900 in FIGS. 9A-9D. These qubit circuit 1100 includes extra gate controllable wires 1160 that connect the odd wires and the even wires 950 together. These gate-controllable wires 1160 allow entanglement of qubits 900 on neighboring one-dimensional arrays 1000, thereby achieving a fully two-dimensional array 1100. In FIG. 11, each qubit 900 is connected to six neighbors, effectively forming a hexagonal array.

Selected measurements that make it possible to perform any Clifford operation on the qubits 900 in the qubit array 1100. The Clifford operations are the complete set of topologically protected qubit operations.

Entangling two qubits entails measuring the joint probability $P_{ij} P_{kl}$, where the subscripts ij,kl label the MZMs located on two qubits 900. For two qubits 900 located on the same one-dimensional array 1000, the tunnel junction to a pair 1,2 and 1', 4' is turned on, for instance. Current passes between leads A and B in FIG. 11. The two teleportation paths through junctions 1,2 and 1', 4' will interfere, so that the current is proportional to $|T_{12}+T_{1'4'}|^2$. The cross term is proportional to the product $P_{12}P_{1'4'}$, as desired. This allows the measurement of the product of the Pauli operators ZZ', XX', ZX', and XZ'.

For two qubits 900 located on neighboring one-dimensional arrays 1000, such as between 1,2 and 1", 4" in FIG. 11, the junctions 942 on these four MZM locations and the cross wire 5,6 are turned on. The total current is given by the interference between these arms and given by $|T_{56}+ T_{12}T_{1"4"}|^2$. The cross term gives the desired joint parity $P_{12}P_{1"4"'}$. This allows measurement of the product of the Pauli operators ZZ", XX", ZX", and XZ".

Lithographically Patterned Au(111) Nanowire Arrays with EuS Layers

The Au/EuS system described above is amenable to flexible nano-fabrication methods. For example, a single topological qubit can be constructed out of two or more wires that are cross-linked, forming a tetron or hexon, which have been proposed as building blocks of quantum computing circuits. An array of tetrons and/or hexons can be constructed without too much difficulty. In particular, instead of braiding by physically moving MZMs, a measurement based topological qubit design using a purely superconducting circuit is well suited with an inventive Au/EuS system.

More specifically, heterostructures of thin film V(20 nm)/Au(4 nm) can be grown in a molecular beam epitaxy (MBE) system with a base vacuum of about $3.7 \times 10^{-10}$ torr. Au nanowires, or nanoribbons, with a thickness of 4 nm and a wire width around 100 nm (or less) are fabricated after the growth of Au/V heterostructures. The nanowires are sculpted out of the wafer-scale Au thin film by following a standard e-beam lithography and Ar ion milling process. During the nano fabrications, the surface of the superconductor vanadium is protected in-situ using a high vacuum system (base vacuum $10^{-8}$ torr) that combines both the ion milling and thin film evaporation sources, thereby guaranteeing the high quality of the superconducting vanadium. Any shape of nanowire, or a network of nanowires, can be designed and fabricated using standard e-beam lithography techniques. The surfaces of Au nanowires fabricated in this way are ultra-clean as seen by the atomic-resolution STM images in the inset of FIG. 1D and FIG. 4C.

A post growth of EuS magnetic insulator is carried out in a high vacuum system with a base vacuum of about $10^{-8}$ torr. The EuS growth, from islands to a continuous layer, on Au(111) surface is controllable by varying the EuS thickness. EuS islands facilitate the STM measurements because the EuS thick films are too insulating for STM measurements.

FIGS. 12A-12E are SEM images of patterned Au(111) nanowires. FIG. 12A shows an SEM image of an array of Au(111) nanowires. Each nanowire is sitting in a square area with four alignment marks (cross) at the corners. FIG. 12B shows a close-up SEM image of the region marked by the square in FIG. 12A. The inset shows a close-up of the area marked by an oval. The SEM is taken from an angle so that the vertical layout of the nanowire can be seen.

The scalable Au(111) nanowire array in FIGS. 12A and 12B is fabricated out of the epitaxially grown Au(111) thin films using standard lithography and custom nanofabrication processes. The Au(111) nanowires have widths of about 70 nm and lengths of tens of microns. The Au(111) layer is sitting on a vanadium film. Fabricating the Au(111) nanowires exposes the vanadium surface, which is vulnerable to oxidation. This oxidation can be detrimental to the induced superconductivity in the Au(111) nanowire. To prevent this undesired oxidation, the exposed vanadium surface is protected during nanofabrication, e.g., by depositing an insulator, such as $Al_2O_3$, on the exposed vanadium surface, as shown by the successfully induced superconductivity evidenced by the measurements described above.

FIGS. 12C-12E show that other shapes can be made using similar processes. For example, FIG. 12C shows a L-shaped Au(111) nanowire. Similarly, FIG. 12D shows a tetron array structure for MZM qubits as described above. The inset shows a typical unit cell of the array. FIG. 12E shows the patterned "H" bar structures for MZM qubits in greater detail. The dark patch regions in FIGS. 12D and 12E are solvent residues left during the nanofabrication, which can be easily removed by following standard cleaning procedures. As described above, tetrons and other shapes can trap MZMs at their ends, which can be useful for quantum computing and other applications.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain. using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus comprising:
    a substrate;
    a superconducting film on the substrate;
    a conductive film on the superconducting film and having a free surface with a Rashba spin-orbit splitting of at least 1 meV;
    a magnetic insulator, on the free surface of the conductive film, to shift a Fermi level of the conductive film and to generate an exchange field; and
    a magnetic field source to apply a magnetic field to the superconducting substrate, the conductive film, and the magnetic insulator, the magnetic field and the exchange field causing a Majorana zero mode (MZM) to form at opposite ends of the magnetic insulator,
    wherein the conductive film comprises one of a (111) gold film, a (111) silver film, a platinum film, or a bismuth film.

2. The apparatus of claim 1, wherein the superconducting film comprises at least one of vanadium, niobium, titanium, tin, aluminum, gallium, nitrogen, germanium, or silicon.

3. The apparatus of claim 1, wherein the conductive film is patterned into a wire and the magnetic insulator forms an island with an edge overlapping an edge of the wire.

4. The apparatus of claim 3, further comprising:
    a first tunnel lead, coupled to a first end of the wire, to detect a first zero bias peak (ZBP) associated with the MZM; and
    a second tunnel lead, coupled to a second end of the wire, to detect a second ZBP associated with the MZM.

5. The apparatus of claim 4, wherein the magnetic insulator is configured to serve as a tunnel barrier.

6. The apparatus of claim 4, further comprising:
    a gate, coupled to the wire between the first end and the second end, to modulate a chemical potential of the magnetic insulator.

7. The apparatus of claim 6, wherein the magnetic insulator is configured to act as a gate dielectric.

8. The apparatus of claim 4, wherein the wire forms a shape that can support at least four MZMs.

9. The apparatus of claim 1, wherein the magnetic insulator comprises at least two monolayers of at least one of EuS, EuO, GdN, CrTe, a magnetic perovskite, CrTe, a dilute magnetic semiconductor, or a ferrite.

10. The apparatus of claim 1, wherein the magnetic insulator is patterned into a wire.

11. An apparatus comprising:
    a superconductor;
    a conductive film on the superconductor;
    a magnetic insulating wire, on the conductive film, to shift a Fermi level of the conductive film and to generate an exchange field such that a Majorana zero mode (MZM) forms at ends of the magnetic insulating wire in response to the exchange field and to an external magnetic field;
    tunneling junctions, in electrical communication with the ends of the magnetic insulating wire, to measure the MZM;
    top gates, on the magnetic insulating wire, to actuate the tunneling junctions.

12. The apparatus of claim 11, wherein the conductive film, the magnetic insulating wire, the tunneling junctions, and the top gates are on a Coulomb blockade island.

13. The apparatus of claim 11, wherein the conductive film is patterned and further comprising:
    a conductive interference arm in parallel with the conductive film; and
    another gate, in electrical communication with the conductive interference arm, to modulate a resistance of the conductive interference arm.

14. A quantum circuit comprising an array of the apparatus according to claim 11.

15. A method comprising:
applying a magnetic field to a conductive film disposed between a superconductor and a magnetic insulator and having a Rashba spin-orbit splitting of at least 1 meV;
measuring a first zero bias peak (ZBP) at a first end of the magnetic insulator; and
measuring a second ZBP at a second end of the magnetic insulator opposite to the first end, the first ZBP and the second ZBP indicating formation of a Majorana zero mode at the first end and the second end of the magnetic insulator.

16. A method comprising:
forming a conductive film having a free surface with a Rashba spin-orbit splitting of at least 1 meV on a superconducting film; and
depositing a magnetic insulator on the free surface of the conductive film to shift a Fermi level of the conductive film and to generate an exchange field, wherein forming the conductive film comprises:
patterning the conductive film and/or the magnetic insulator into a wire; and
forming tunnel leads at the ends of the wire.

17. The method of claim 16, further comprising:
patterning the conductive film before depositing the magnetic insulator on the conductive film.

18. The method of claim 16, further comprising:
forming a gate on the wire between the ends of the wire.

* * * * *